(12) United States Patent
Chevalier et al.

(10) Patent No.: US 11,251,084 B2
(45) Date of Patent: Feb. 15, 2022

(54) METHOD FOR PRODUCING A DIODE

(71) Applicant: STMicroelectronics (Crolles 2) SAS, Crolles (FR)

(72) Inventors: Pascal Chevalier, Chapareillan (FR); Alexis Gauthier, Meylan (FR); Gregory Avenier, Saint Nazaire les Eymes (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/909,378

(22) Filed: Jun. 23, 2020

(65) Prior Publication Data

US 2020/0411382 A1    Dec. 31, 2020

(30) Foreign Application Priority Data

Jun. 28, 2019 (FR) .................................. 1907149

(51) Int. Cl.
| | |
|---|---|
| *H01L 21/8222* | (2006.01) |
| *H01L 21/265* | (2006.01) |
| *H01L 27/06* | (2006.01) |
| *H01L 29/06* | (2006.01) |
| *H01L 29/66* | (2006.01) |
| *H01L 29/737* | (2006.01) |
| *H01L 29/93* | (2006.01) |

(52) U.S. Cl.
CPC .... *H01L 21/8222* (2013.01); *H01L 21/26513* (2013.01); *H01L 27/0664* (2013.01); *H01L 29/0649* (2013.01); *H01L 29/66174* (2013.01); *H01L 29/66242* (2013.01); *H01L 29/7371* (2013.01); *H01L 29/93* (2013.01)

(58) Field of Classification Search
CPC .......... H01L 21/8222; H01L 21/26513; H01L 27/0664; H01L 29/0649; H01L 29/66174; H01L 29/66242; H01L 29/7371; H01L 29/93; H01L 29/1004; H01L 29/0684
See application file for complete search history.

(56) References Cited

U.S. PATENT DOCUMENTS

| | | | | |
|---|---|---|---|---|
| 5,405,790 | A | * | 4/1995 | Rahim ................ H01L 21/8249 148/DIG. 9 |
| 2001/0031538 | A1 | * | 10/2001 | Dekker ............. H01L 29/66174 438/379 |
| 2003/0064575 | A1 | | 4/2003 | Losehand et al. |
| 2005/0161769 | A1 | | 7/2005 | Coolbaugh et al. |
| 2007/0224747 | A1 | | 9/2007 | Rochel et al. |

(Continued)

FOREIGN PATENT DOCUMENTS

| | | |
|---|---|---|
| EP | 1198009 A2 | 4/2002 |
| EP | 1229584 A2 | 8/2002 |

(Continued)

OTHER PUBLICATIONS

NPI Search Report and Written Opinion for FR 1907149 dated Feb. 18, 2019 (10 pages).

(Continued)

*Primary Examiner* — Syed I Gheyas
(74) *Attorney, Agent, or Firm* — Crowe & Dunlevy

(57) ABSTRACT

At least one bipolar transistor and at least one variable capacitance diode are jointly produced by a method on a common substrate.

29 Claims, 18 Drawing Sheets

(56) References Cited

U.S. PATENT DOCUMENTS

| | | | | |
|---|---|---|---|---|
| 2008/0102593 A1* | 5/2008 | Meister | ............... | H01L 29/93 |
| | | | | 438/379 |
| 2009/0206335 A1 | 8/2009 | Heinemann et al. | | |
| 2012/0098099 A1* | 4/2012 | Lee | ............. | H01L 29/732 |
| | | | | 257/577 |
| 2015/0140771 A1 | 5/2015 | Fox et al. | | |
| 2019/0148531 A1 | 5/2019 | Gauthier et al. | | |

FOREIGN PATENT DOCUMENTS

| | | |
|---|---|---|
| EP | 3273483 A1 | 1/2018 |
| JP | S63148684 A | 6/1988 |
| WO | 9809335 A1 | 3/1998 |

OTHER PUBLICATIONS

Zampardi, Pete, et al: "Integration of Hyperabrupt Varactor Diodes with High-Speed Hererojunction Bipolar Transistors," Nov. 2017 (8 pages).

Joachim N Burghartz et al: "Integrated and Microwave Components in BiCMOS Technology", IEEE Transactions On Electron Devices, IEEE Service Center, Piscataway, NJ, US, vol. 43, N° 9, Sep. 1996.

EP Search Report for co-pending EP Appl. No. 20182438.0 dated Oct. 8, 2020 (9 pages).

* cited by examiner

METHOD FOR PRODUCING A DIODE

PRIORITY CLAIM

This application claims the priority benefit of French Application for Patent No. 1907149, filed on Jun. 28, 2019, the content of which is hereby incorporated by reference in its entirety to the maximum extent allowable by law.

TECHNICAL FIELD

The present disclosure relates generally to methods for producing electronic components, and more particularly, methods for producing variable capacitance diodes, also called varicap diodes or varactors.

BACKGROUND

A varicap diode is an electronic dipole provided with two terminals between which a p-n junction is formed.

When it is subjected to a direct polarization, the varicap diode has an operation similar to that of a conventional diode, that is to say, it becomes on when a certain voltage threshold is exceeded.

Conversely, if an inverse polarization voltage is applied across its terminals, the varicap diode differs from a conventional diode in the off state in that it theoretically behaves not like an open circuit, but rather like a capacitor. In practice, a similar capacitive phenomenon also occurs, but to a lesser extent, for a reverse-biased conventional diode.

Whereas an effort is rather made to avoid this capacitive phenomenon in the case of a conventional diode, it is encouraged as much as possible in the case of a varicap diode.

There is a need in the art to increase the electrical capacity of the current varicap diodes. There is further a need to improve the methods making it possible to produce a varicap diode.

SUMMARY

One embodiment addresses all or some of the drawbacks of known varicap diodes and the known methods for producing same.

One embodiment provides a method for producing, jointly on a same (i.e., common or shared) substrate, at least one bipolar transistor and at least one variable capacitance diode.

According to one embodiment, said diode includes a p-n junction constituted by: a first region with a first type of conductivity; and a second region with a second type of conductivity; said first region and an extrinsic base of said transistor being made during a same step.

According to one embodiment, said first region is made level with an extrinsic collector region constituting said second region.

According to one embodiment, said first region is made by epitaxy.

According to one embodiment, a sector of said second region is doped by ion implantation.

According to one embodiment, the first type of conductivity is p and the second type of conductivity is n.

According to one embodiment, the first type of conductivity is n and the second type of conductivity is p.

According to one embodiment, said diode includes a varactor with hyperabrupt p-n junction.

One embodiment provides a method as described, having the following steps: providing a substrate inside which a first extrinsic collector region, laterally delimited by a first deep insulating trench and by a second deep insulating trench, has a first sink inserted between said first deep insulating trench and a first shallow insulating trench and inside which said second extrinsic collector region, laterally delimited by a third deep insulating trench and by said first deep insulating trench, has a second sink, inserted between said third deep insulating trench and a second shallow insulating trench, and a third sink inserted between said first deep insulating trench and a third shallow insulating trench; forming, on the surface of said substrate, a stack formed by a first layer, a second layer, covering said first layer, a third layer, covering said second layer, a fourth layer, covering said third layer, a fifth layer, covering said fourth layer, and a sixth layer, covering said fifth layer; making, in said stack and level with part of said surface of said substrate where said first extrinsic collector region is flush, a through opening separating said stack into a first stack made up of first areas of said layers and a second stack made up of second areas of said layers; producing, in said first opening, a first deposit and a second deposit, said second deposit completely covering said first deposit; producing, in said first opening, two spacers each having a first part and a second part, said first part of each spacer being constituted by a horizontal portion, partially covering the upper surface of said second deposit, and a vertical portion flush with the upper surface of said first area of the sixth layer or the upper surface of said second area of said sixth layer; eliminating said first area of said sixth layer, said second area of said sixth layer, said vertical portions of said first parts of said spacers and said second parts of said spacers; producing a third deposit above said second deposit, said horizontal portions of said first parts of said spacers, a portion of said first area of said fifth layer and a portion of said second area of said fifth layer; eliminating said first area of said fifth layer with the exception of said portion of said first area of said fifth layer and eliminating said second area of said fifth layer with the exception of said portion of said second area of said fifth layer; depositing a seventh layer covering the upper surface of said third deposit, the lateral surfaces of said third deposit, the lateral surfaces of said portion of said first area of said fifth layer and the lateral surfaces of said portion of said second area of said fifth layer; eliminating all of said first area of said fourth layer and all of said second area of said fourth layer; producing, below said portion of said first area of said fifth layer and a vertical portion of said seventh layer, a first link contacting said second layer and producing, below said portion of said second area of said fifth layer and a vertical portion of said seventh layer, a second link contacting said second layer; making, through said first areas of said first, second and third layers and level with part of said surface of said substrate where they are flush with said second extrinsic collector region, a part of said second shallow insulating trench and a part of said third shallow insulating trench, a second opening separating said first area of said first layer into a first portion and a second portion, separating said first area of said second layer into a first portion and a second portion and separating said first area of said third layer into a first portion and a second portion.

One embodiment provides a method as described, further having the following steps: eliminating all of said first portion of said first area of said third layer, eliminating said second portion of said first area of said third layer with the exception of a first element located level with said first link and eliminating said second area of said third layer with the exception of a second element located level with said second link; producing an eighth layer, a first area of said eighth layer covering a part of the surface of the second area of said second layer not covered by said second element, a second area of said eighth layer completely covering said first portion of said first area of said second layer, a third area of said eighth layer covering a part of the surface of the second portion of said first area of said second layer not covered by said first element and a fourth area of said eighth layer constituting said first region; depositing a sacrificial layer, a first portion of said sacrificial layer covering said first region and a second portion of said sacrificial layer covering said seventh layer, said first link and said second link, said second portion of said sacrificial layer extending laterally over a first element of said third area of said eighth layer and over a second element of said first area of said eighth layer; eliminating parts of said areas and portions of said eighth layer and said second layer not covered by said first and second portions of said sacrificial layer; completely eliminating said first portion of said first area of said first layer, eliminating said second portion of said first area of said first layer with the exception of a fifth element covered by said third element and eliminating said second area of said first layer with the exception of a sixth element covered by said fourth element; producing second spacers on either side of said first region, producing third spacers on either side of said first deposit and producing fourth spacers on either side of said second deposit; producing a first contact reacting element on said second trench, a second contact reacting element on said third trench, a third contact reacting element on said first region, a fourth contact reacting element on said first sink, a fifth contact reacting element on said first element of said third area of said eighth layer, a sixth contact reacting element on said second element of said first area of said eighth layer and a seventh contact reacting element on said third deposit, said first, second and third contact reacting elements constituting terminals of said variable capacitance diode, said fourth contact reacting element constituting a collector terminal of said bipolar transistor, said fifth and seventh contact reacting elements constituting base terminals of said bipolar transistor and said eighth contact reacting element constituting an emitter terminal of said bipolar transistor.

One embodiment provides an electronic circuit including at least one of varactor and at least one bipolar transistor, obtained using the method as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the method for preparing the substrate is not described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 10:
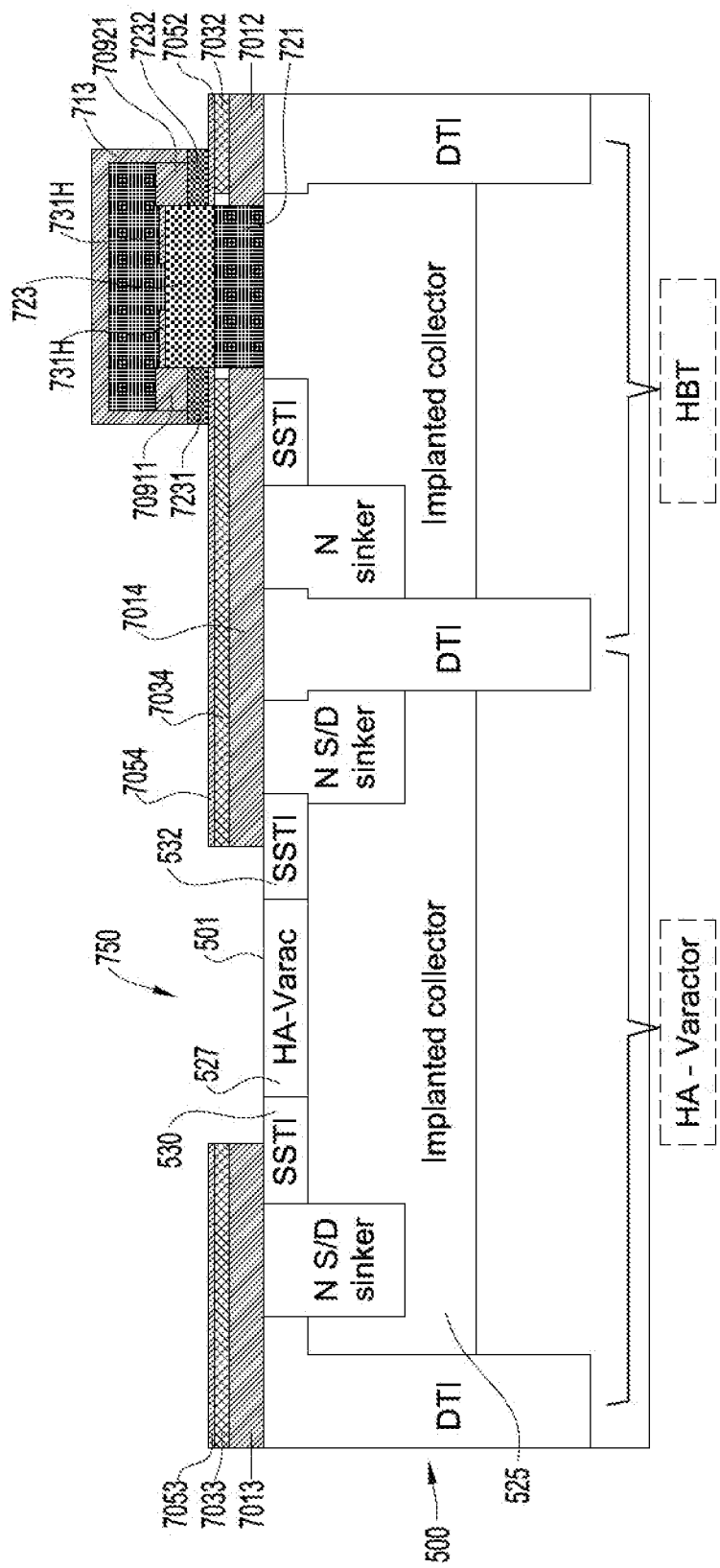
Figure 11:
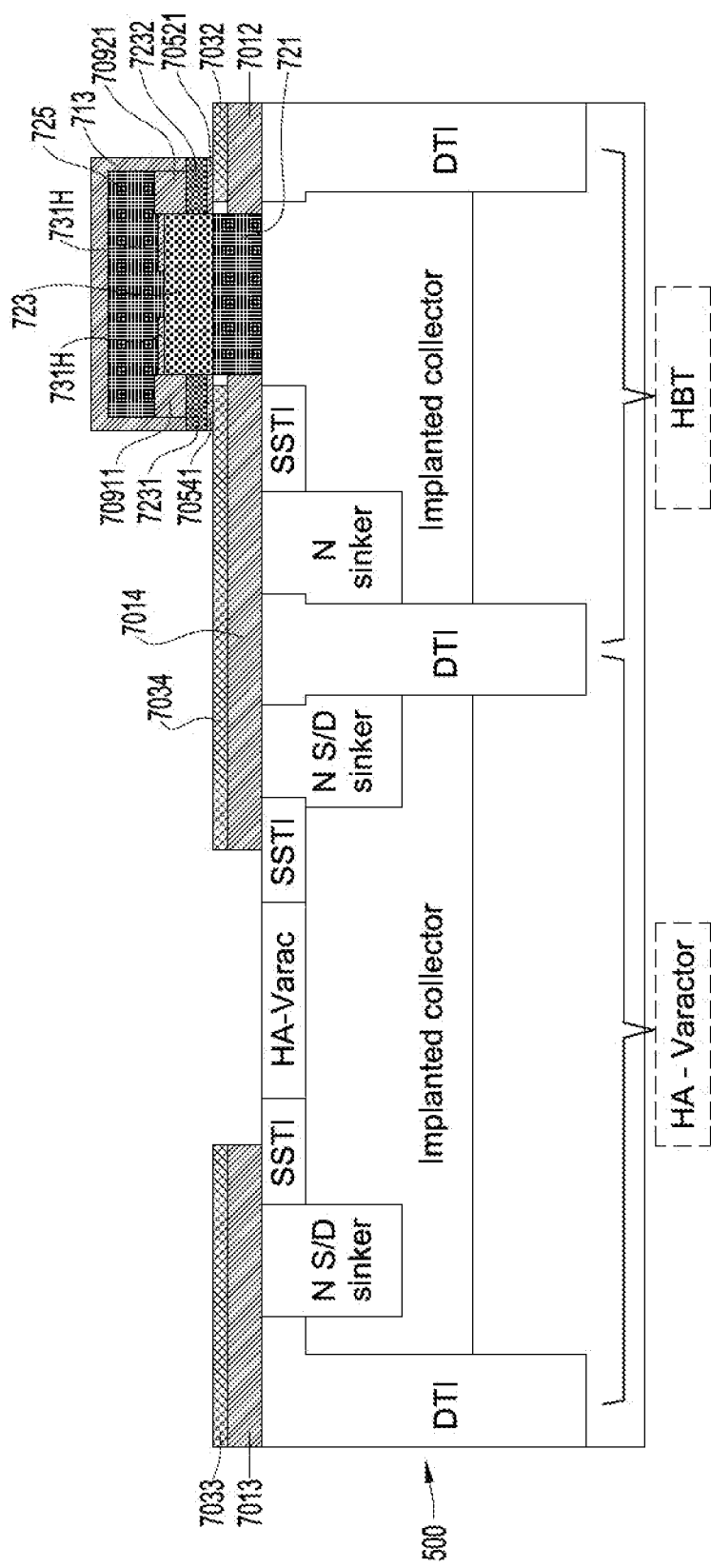
Figure 12:
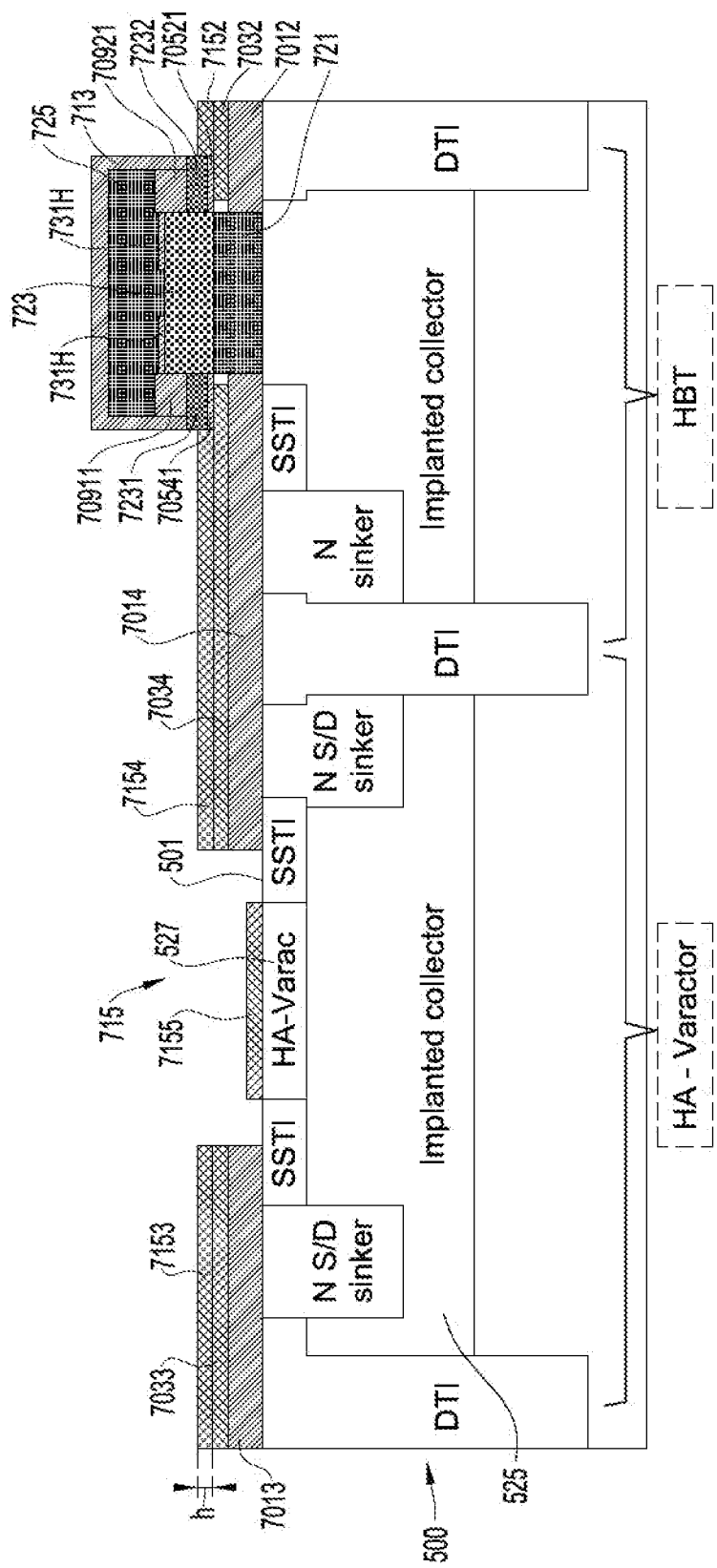

FIGS. 1 to 17 below illustrate successive steps of a same embodiment of a method for producing a varicap diode 100 or variable capacitance diode 100 or varistor 100. According to this embodiment, the varicap diode 100 is cointegrated with a Heterojunction Bipolar Transistor (HBT) 300, here of the BiCMOS (Bipolar CMOS) type. In other words, the described embodiment makes it possible to produce, on a same (i.e., common or shared) substrate and jointly, a bipolar transistor 300 and a varicap diode 100. FIGS. 2 to 9 below show steps more particularly dedicated to producing the bipolar transistor 300. FIGS. 10 to 12 below in turn show steps more particularly dedicated to producing the varicap diode 100.

To simplify, what is disclosed below in relation to FIGS. 1 to 17 uses the example of a method in which a single variable capacitance diode 100 and a single bipolar transistor 300 are made jointly. Nevertheless, it is understood that this method can be extended to the production, jointly and on a same substrate, of any number of bipolar transistors 300 and any number of variable capacitance diodes 100, these two numbers being able to be different.

Figure 1:
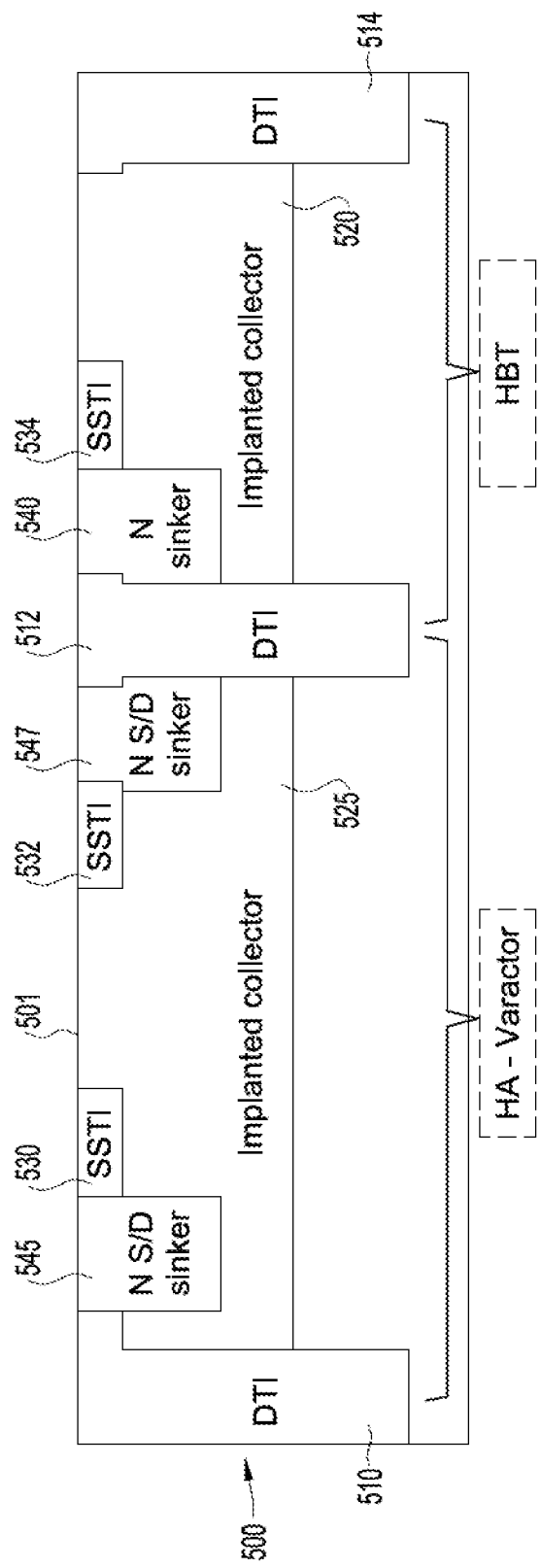
FIGS. 1-17 show, schematically and in cross-section, steps of one embodiment of a method for producing a varicap diode and bipolar transistor.

FIG. 1 shows, schematically and in cross-section, a step of one embodiment of a method for producing a varicap diode and bipolar transistor.

According to this embodiment, one begins by providing a substrate 500 constituted, for example, by a monocrystalline silicon wafer. In FIG. 1, the substrate 500 has first isolation substrates (DTI) 510, 512 and 514, for example, Deep Trench Isolation (DTI) substrates. These deep isolation trenches 510, 512 and 514 extend vertically from an upper surface 501 of the substrate 500. The trenches 510, 512 and 514 thus laterally delimit, in the substrate 500, two locations: a first location (HA-Varactor, for Hyperabrupt Varactor), comprised between the trenches 510 and 512, where it is desired to produce the variable capacitance diode 100, hereinafter referred to as "diode location" (on the left, in FIG. 1); and a second location (HBT, for Heterojunction Bipolar Transistor), comprised between the trenches 512 and 514, where one wishes to produce the bipolar transistor 300, referred to hereinafter by the expression "transistor location" (on the right, in FIG. 1).

The deep isolation trenches 510, 512 and 514 of the substrate 500 separate, in FIG. 1, two extrinsic collector regions 520, 525 (Implanted collector). The regions 520 and 525 extend vertically while rising, toward the upper surface 501 of the substrate 500, from a depth lower than that of the trenches 510, 512 and 514. More specifically: a first extrinsic collector region 520, located at the transistor location, is inserted between the deep isolation trenches 512 and 514; and a second extrinsic collector region 525, located at the diode location, is inserted between the deep isolation trenches 510 and 512.

The extrinsic collector regions 520 and 525 are therefore separated from one another by a common isolation trench, in the case at hand the trench 512 of FIG. 1. These extrinsic collector regions 520 and 525 are, for example, obtained by ion implantation, below the upper surface 501 of the substrate 500, of a dopant element with a first conductivity type, for example, type n (for example, phosphorus or arsenic). The regions 520 and 525 then have an increasingly strong concentration of dopant element as one moves away from the upper surface 501 of the substrate 500.

The substrate 500 further includes second isolating structures 530, 532 and 534 (SSTI), for example, Super Shallow Trench Isolation (SSTI). These trenches 530, 532 and 534 extend vertically, from the upper surface 501 of the substrate 500, to a depth of less than that of the regions 520 and 525. The shallow isolating trenches 530, 532 and 534 have a depth of between about 50 nm and about 100 nm, preferably between 50 nm and 100 nm.

A first sink 540 (N sinker), located in the transistor location, is inserted between the trench 512 and the trench 534. This first sink 540 has the first conductivity type, in this example, type n.

Two second sinks 545 and 547 (N S/D sinker), located in the diode location, are respectively inserted: between the deep isolation trench 510 and the shallow isolation trench 530, for the sink 545; and between the shallow isolation trench 532 and the deep isolation trench 512, for the sink 547.

These second sinks 545 and 547 have the first conductivity type, in this example, type n.

The first sink 540 and second sinks 545, 547 extend vertically, from the upper surface 501 of the substrate 500, inside the first and second extrinsic collector regions 520, 525, respectively. In other words, the sinks 540, 545 and 547 make it possible, from the upper surface 501 of the substrate 500, to respectively contact the extrinsic collector regions 520 and 525.

In FIG. 1, the extrinsic collector region 520 is bordered on either side by the deep isolating trenches 512 and 514 (respectively located on the left and the right of the region 520, in FIG. 1). The sink 540 is alongside the deep isolating trench 512 (to the right of the trench 512, in FIG. 1). The shallow isolating trench 534 is alongside the well 540 on the side where the well 540 does not touch the deep isolating trench 512 (on the right side, in FIG. 1). Part of the extrinsic collector region 520 is flush with the surface 501 of the substrate 500 between the shallow isolation trench 534 and the deep isolation trench 514.

In FIG. 1, the extrinsic collector region 525 is bordered on either side by the deep isolating trenches 510 and 512 (respectively located on the left and the right of the region 525, in FIG. 1). The sink 545 is alongside the deep isolating trench 510 (to the right of the trench 510, in FIG. 1). The shallow isolating trench 530 is alongside the sink 545 on the side where the sink 545 does not touch the deep isolating trench 510 (on the right side, in FIG. 1). The sink 547 is alongside the deep isolating trench 512 (to the left of the trench 512, in FIG. 1). The shallow isolating trench 532 is alongside the sink 547 on the side where the sink 547 does not touch the deep isolating trench 512 (on the left side, in FIG. 1). Part of the extrinsic collector region 525 is flush with the surface 501 of the substrate 500 between the shallow isolation trenches 530 and 532.

In the remainder of the description, the embodiment of the method described in relation with FIGS. 2 to 17 primarily consists of performing operations above the upper surface 501 of the substrate 500. Unless otherwise mentioned, the substrate 500 of FIGS. 2 to 17 therefore remains identical to the substrate 500 as disclosed in relation with FIG. 1. To simplify, the substrate 500 will therefore not be described in detail again in the Figures below.

Figure 2:
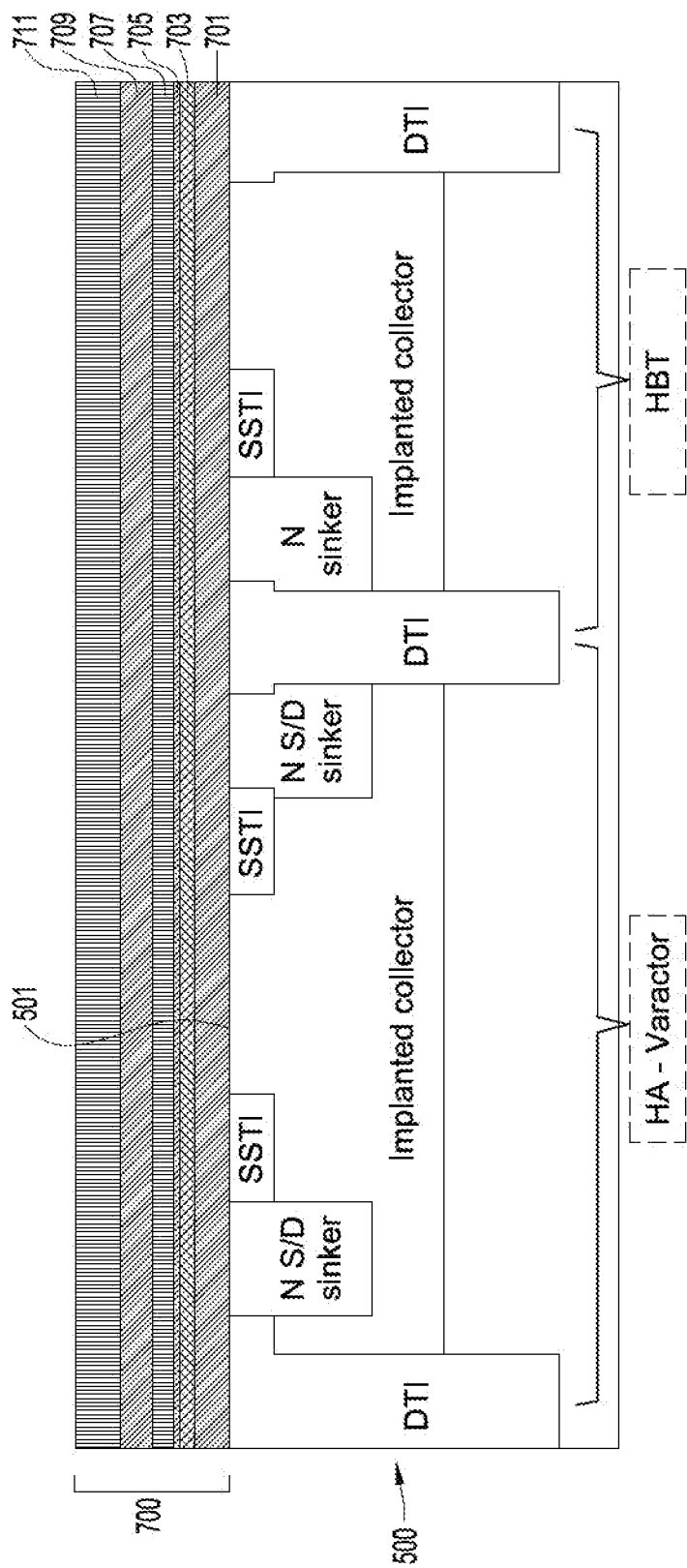

FIG. 2 shows, schematically and in cross-section, another step of the embodiment of the method for producing a varicap diode and bipolar transistor, made from the structure as disclosed in relation with FIG. 1. The step disclosed in relation with FIG. 2 is more particularly dedicated to producing a part of the future bipolar transistor 300.

During this step, a stack 700 of successive layers resting on top of one another is deposited over the entire upper surface 501 of the substrate 500.

As illustrated in FIG. 2, this stack 700 more specifically comprises: a first layer 701 constituted by an oxide, for example, a silicon oxide, completely covering the upper surface 501 of the substrate 500; a second layer 703 preferably constituted by polycrystalline silicon with a second conductivity type, in this example, type p, completely covering the upper surface of the first layer 701; a third layer 705 constituted by an oxide, for example, the same oxide as that from which the first layer 701 is constituted, completely covering the upper surface of the second layer 703; a fourth layer 707 constituted by a nitride, for example, a silicon nitride, completely covering the upper surface of the third layer 705; a fifth layer 709 constituted by an oxide, for example, the same oxide as that from which the first layer 701 is constituted, completely covering the upper surface of the fourth layer 707; and a sixth layer 711 constituted by a nitride, for example, the same nitride as that from which the fourth layer 707 is constituted, completely covering the upper surface of the fifth layer 709.

The first layer 701 has a thickness of about 50 nm, preferably equal to 50 nm. The second layer 703 has a thickness of about 40 nm, preferably equal to 40 nm. The third layer 705 has a thickness of about 5 nm, preferably equal to 5 nm. The fourth layer 707 has a thickness of about 40 nm, preferably equal to 40 nm. The fifth layer 709 has a thickness of about 30 nm, preferably equal to 30 nm. The sixth layer has a thickness of about 40 nm, preferably equal to 40 nm.

Figure 3:
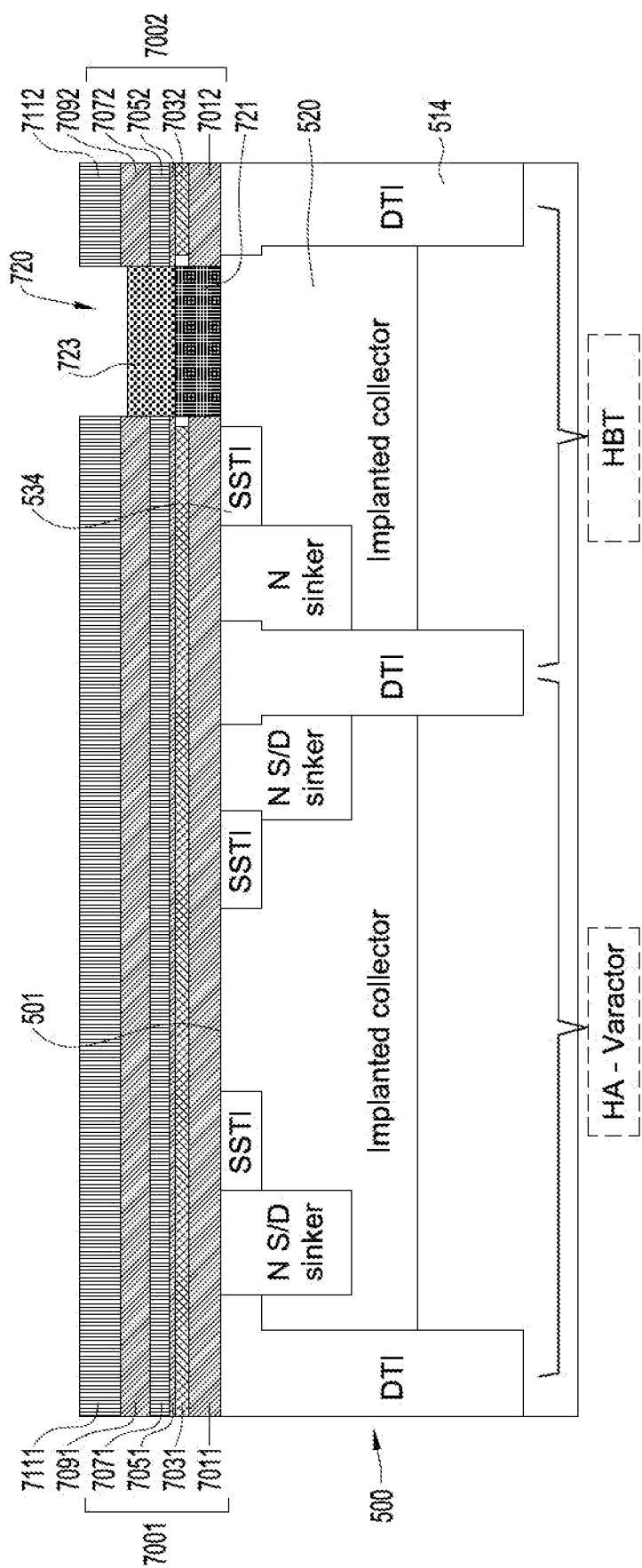

FIG. 3 shows, schematically and in cross-section, still another step of the embodiment of the method for producing a varicap diode and bipolar transistor, made from the structure as disclosed in relation with FIG. 2. The step disclosed in relation with FIG. 3 is more particularly dedicated to producing a part of the future bipolar transistor 300.

During this step, the stack 700 (FIG. 2) is etched locally, over its entire thickness, to a depth level with part of the upper surface 501 of the substrate 500 where the extrinsic collector region 520 is flush, located in the transistor location. This amounts to making a vertical opening 720 passing through the six layers 701, 703, 705, 707, 709 and 711 of the stack 700.

In FIG. 3, the opening 720 thus separates two separate stacks: a first stack 7001 (to the left of the opening 720, in FIG. 3), constituted by first areas 7011, 7031, 7051, 7071, 7091 and 7111 of the layers 701, 703, 705, 707, 709 and 711, respectively; and a second stack 7002 (to the right of the opening 720, in FIG. 3), constituted by second areas 7012, 7032, 7052, 7072, 7092 and 7112 of the layers 701, 703, 705, 707, 709 and 711, respectively.

Part of the extrinsic collector region 520 is thus stripped, inserted, in FIG. 3, between the shallow isolation trench 534 and the deep isolation trench 514.

One next produces, in the entire width of the opening 720 and above this part of the upper surface 501 of the substrate 500 not covered by the stacks 7001 and 7002: a first deposit 721 of a doped material with the first conductivity type, in this example, type n; and second deposit 723 of a doped material with the second conductivity type, in this example, type p, covering the entire upper surface of the deposit 721.

The first and second deposits 721 and 723 are preferably made by epitaxy. This makes it possible to obtain a very pronounced interface between these deposits 721 and 723, therefore a p-n junction characterized by a dopant profile varying very significantly near this interface. This is then called "abrupt" p-n junction.

The first deposit 721 has a thickness substantially equal to the cumulative thickness of the second area 7012 of the first layer 701 and the second area 7032 of the second layer 703, preferably equal to the cumulative thickness of the second areas 7012 and 7032. The first deposit thus has a thickness of about 90 nm, preferably equal to 90 nm. The second deposit 723 has a thickness of about 25 nm, preferably equal to 25 nm.

According to this embodiment, the first deposit 721 constitutes an intrinsic collector of the transistor 300. The second deposit 723 constitutes an intrinsic base of the transistor 300.

Figure 4:
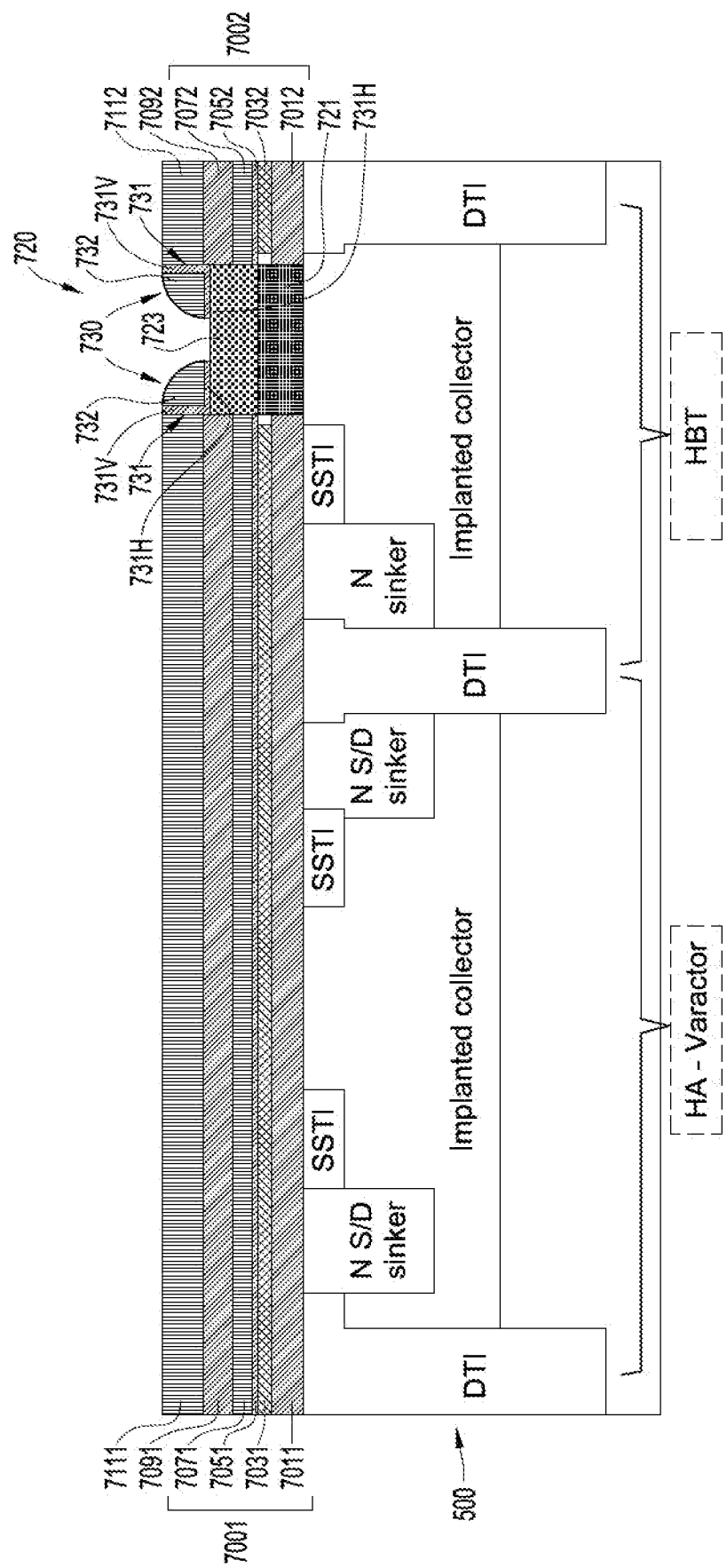

FIG. 4 shows, schematically and in cross-section, still another step of the embodiment of the method for producing a varicap diode and bipolar transistor, made from the structure as disclosed in relation with FIG. 3. The step disclosed in relation with FIG. 4 is more particularly dedicated to producing a part of the future bipolar transistor 300.

During this step, two spacers 730 are produced within the opening 720. These two spacers 730 each rest on part of the upper surface of the second deposit 723 and completely border the lateral walls of the opening 720. The two spacers 730 are not joined, that is to say, they do not completely cover the upper surface of the deposit 723. In FIG. 4, the spacers 730 each bear, inside the opening 720, against a portion of the lateral surface of the first and second areas 7091, 7092 of the fifth layer 709 and against the entire lateral surface of the first and second areas 7111, 7112 of the sixth layer 711.

In the example of FIG. 4, each spacer 730 has an L-shaped first part 731. Each L-shaped first part 731 is constituted by a vertical portion 731V, corresponding to the vertical branch of the L, and a horizontal portion 731H, corresponding to the horizontal branch of the L. The first parts 731 of the spacers 730 are, for example, made from silicon oxide.

The vertical portions 731V of the first parts 731 of the spacers 730 partially cover the lateral surface of the first and second areas 7091, 7092 of the fifth layer 709 and the entire lateral surface of the first and second areas 7111, 7112 of the sixth layer 711. The vertical portions 731V are flush with the upper surface of the first and second areas 7111, 7112 of the sixth layer 711.

The horizontal portions 731H partially cover the upper surface of the deposit 723.

Each spacer 730 further includes a second part 732. This second part 732 is obtained by a nitride deposit on the horizontal portions 731H of the first parts 731. For example, the same nitride is used as that from which the fourth layer 707 is constituted (FIG. 2). This deposit is followed by a selective etching step imparting a D shape to the second parts 732 of the spacers 730.

Figure 5:
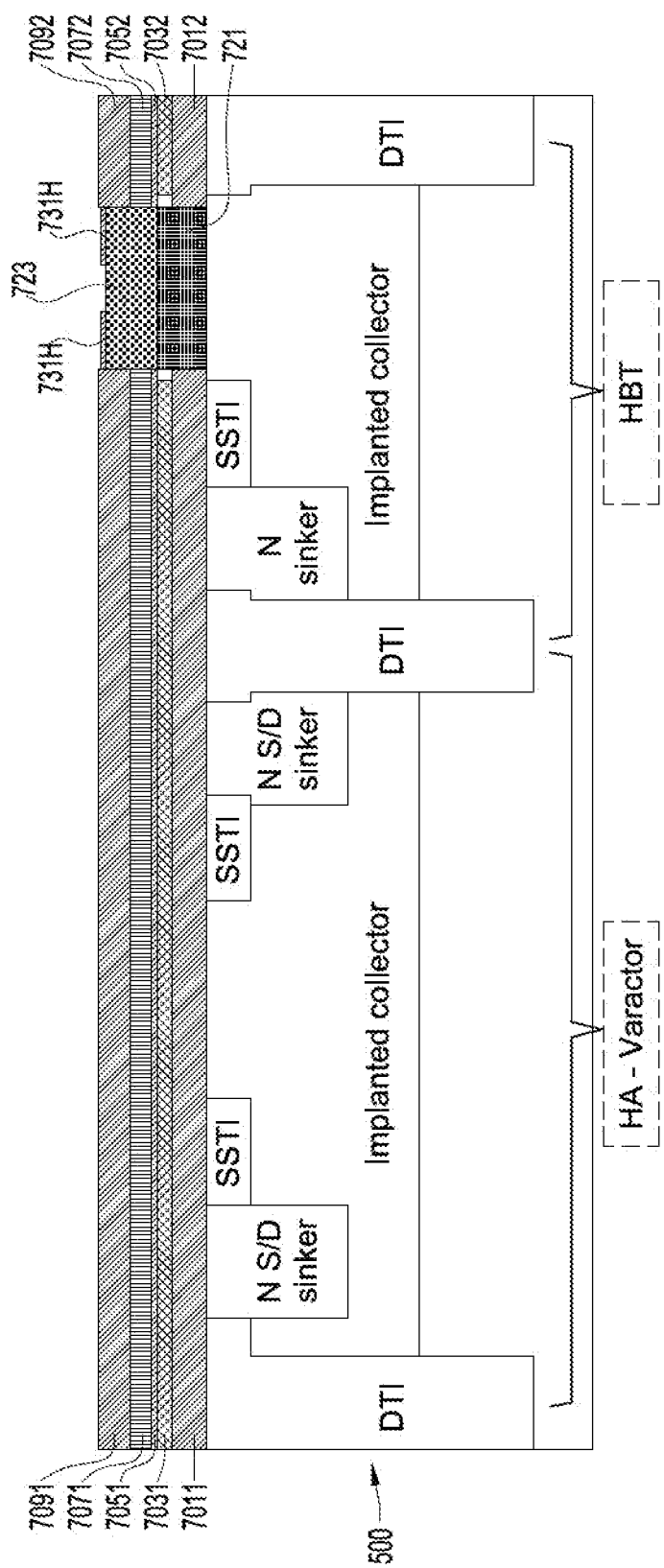

FIG. 5 shows, schematically and in cross-section, still another step of the embodiment of the method for producing a varicap diode and bipolar transistor, made from the structure as disclosed in relation with FIG. 4. The step disclosed in relation with FIG. 5 is more particularly dedicated to producing a part of the future bipolar transistor 300.

During this step, selective etching is done of the nitride located on the surface of the structure as described in relation with FIG. 4. One thus eliminates: all of the first and second areas 7111, 7112 of the sixth layer 711; the vertical portions 731V of the first parts 731 of the spacers 730; and the second parts 732 of the spacers 730.

One therefore only keeps the horizontal portions 731H of the first parts 731 of the spacers 730, which partially cover the upper surface of the second deposit 723. These horizontal portions 731H remain in contact with the first and second areas 7091, 7092 of the fifth layer 709.

Figure 6:
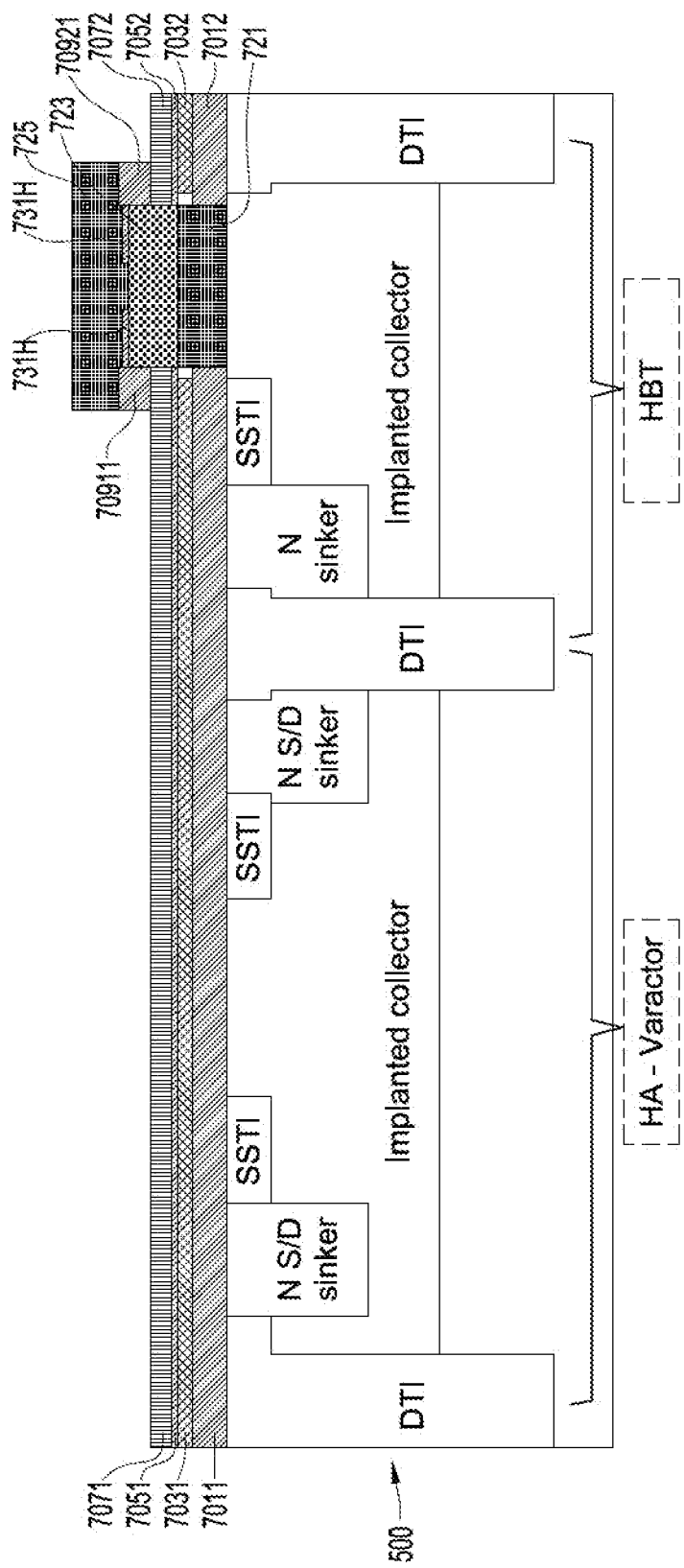

FIG. 6 shows, schematically and in cross-section, still another step of the embodiment of the method for producing a varicap diode and bipolar transistor, made from the structure as disclosed in relation with FIG. 5. The step disclosed in relation with FIG. 6 is more particularly dedicated to producing a part of the future bipolar transistor 300.

During this step, a third deposit 725 is done on top of the second deposit 723 forming the intrinsic base of the transistor 300. This third deposit 725 covers: the entire free upper surface of the second deposit 723; the entire upper surface of each horizontal portion 731H of the first parts 731 of the spacers 730; a portion 70911 of the first area 7091 of the layer 709 (to the left of the second deposit 723, in FIG. 6); and a portion 70921 of the second area 7092 of the layer 709 (to the right of the second deposit 723, in FIG. 6).

This third deposit 725 is constituted by a doped material with the first type of conductivity, in this example, type n. The third deposit 725 constitutes an intrinsic emitter of the transistor 300.

The third deposit 725 is preferably made by epitaxy. This makes it possible to obtain a very pronounced interface between the deposits 725 and 723, therefore a p-n junction characterized by a dopant profile varying very strongly near this interface ("abrupt" p-n junction).

The third deposit 725 has a thickness of about 100 nm, preferably equal to 100 nm.

The first and second areas 7091, 7092 of the fifth layer 709 are next etched in order to keep only the portions 70911, 70921 located below the third deposit 725. FIG. 6 shows the structure obtained after this step for etching of the first and second areas 7091 and 7092 of the layer 709, which is why only the portions 70911 and 70921 are visible in FIG. 6.

Figure 7:
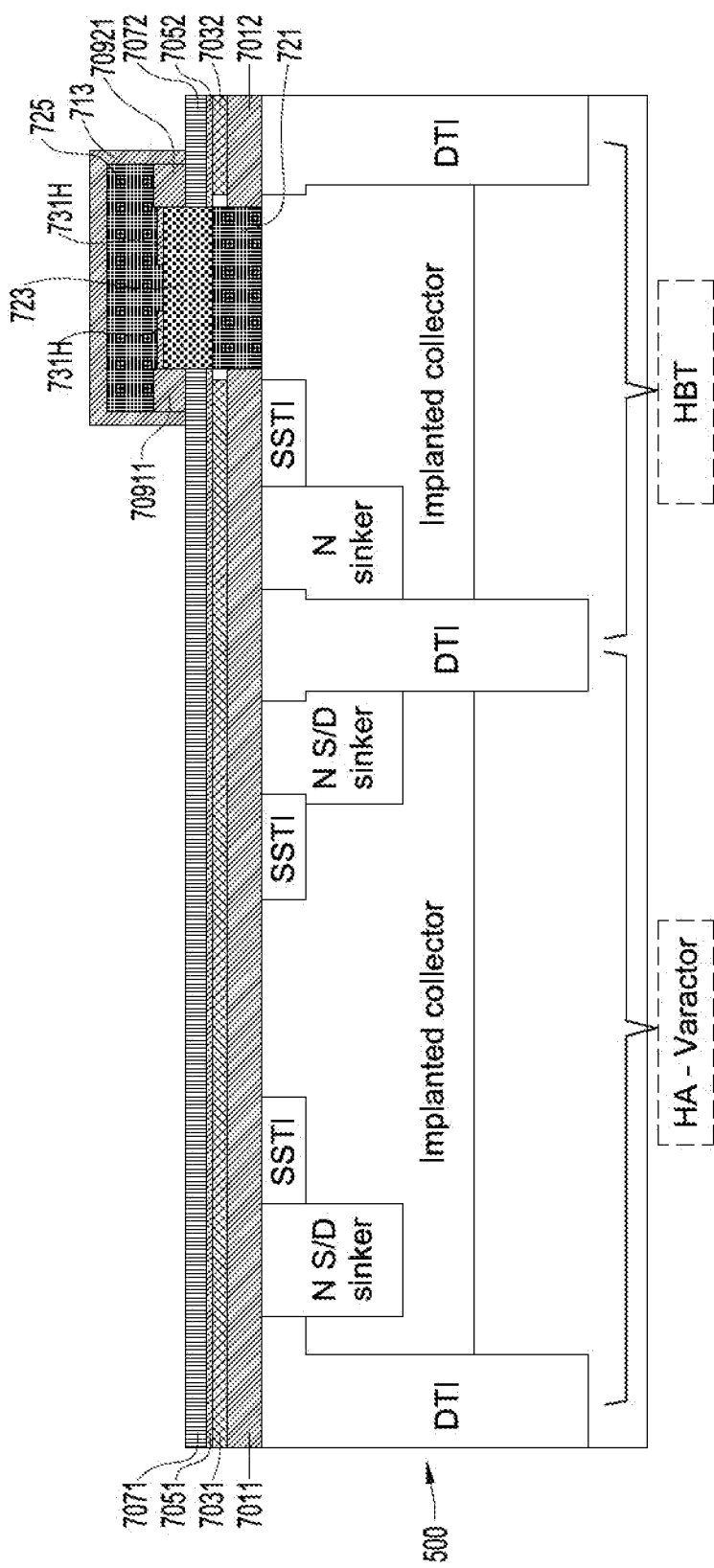

FIG. 7 shows, schematically and in cross-section, still another step of the embodiment of the method for producing a varicap diode and bipolar transistor, made from the structure as disclosed in relation with FIG. 6. The step disclosed in relation with FIG. 7 is more particularly dedicated to producing a part of the future bipolar transistor 300.

During this step, the transistor 300 is covered by a seventh layer 713. In FIG. 7, this seventh layer 713 thus covers: the upper surface and the lateral surfaces of the third deposit 725; and the free lateral surfaces of the portions 70911 and 70921.

This seventh layer 713 constituted by an oxide, for example, the same oxide as that from which the first layer 701 is constituted (FIG. 2).

Figure 8:
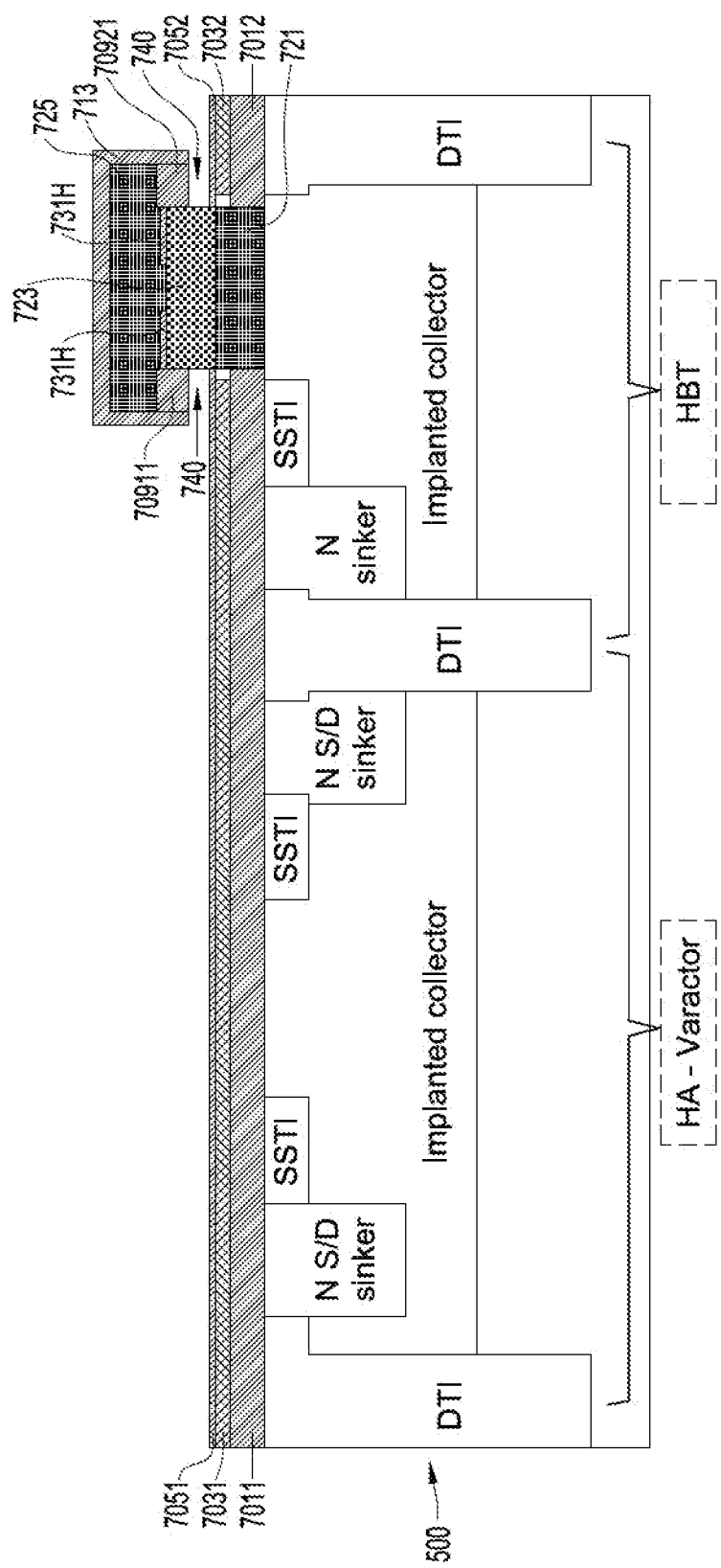

FIG. 8 shows, schematically and in cross-section, still another step of the embodiment of the method for producing a varicap diode and bipolar transistor, made from the structure as disclosed in relation with FIG. 7. The step disclosed in relation with FIG. 8 is more particularly dedicated to producing a part of the future bipolar transistor 300.

During this step, the first and second areas 7071, 7072 of the fourth layer 707 are fully etched, which are therefore not shown in FIG. 8. In other words, the areas 7071 and 7072 are completely eliminated from the fourth layer 707. This etching thus forms two notches 740 between: on the one hand, the first and second areas 7051, 7052 of the third layer 705; and on the other hand, the portions 70911, 70921 and the lower part of the seventh layer 713.

At least part of the lateral surfaces of the second deposit 723 constituting the intrinsic base of the transistor 300 is thus stripped.

Figure 9:
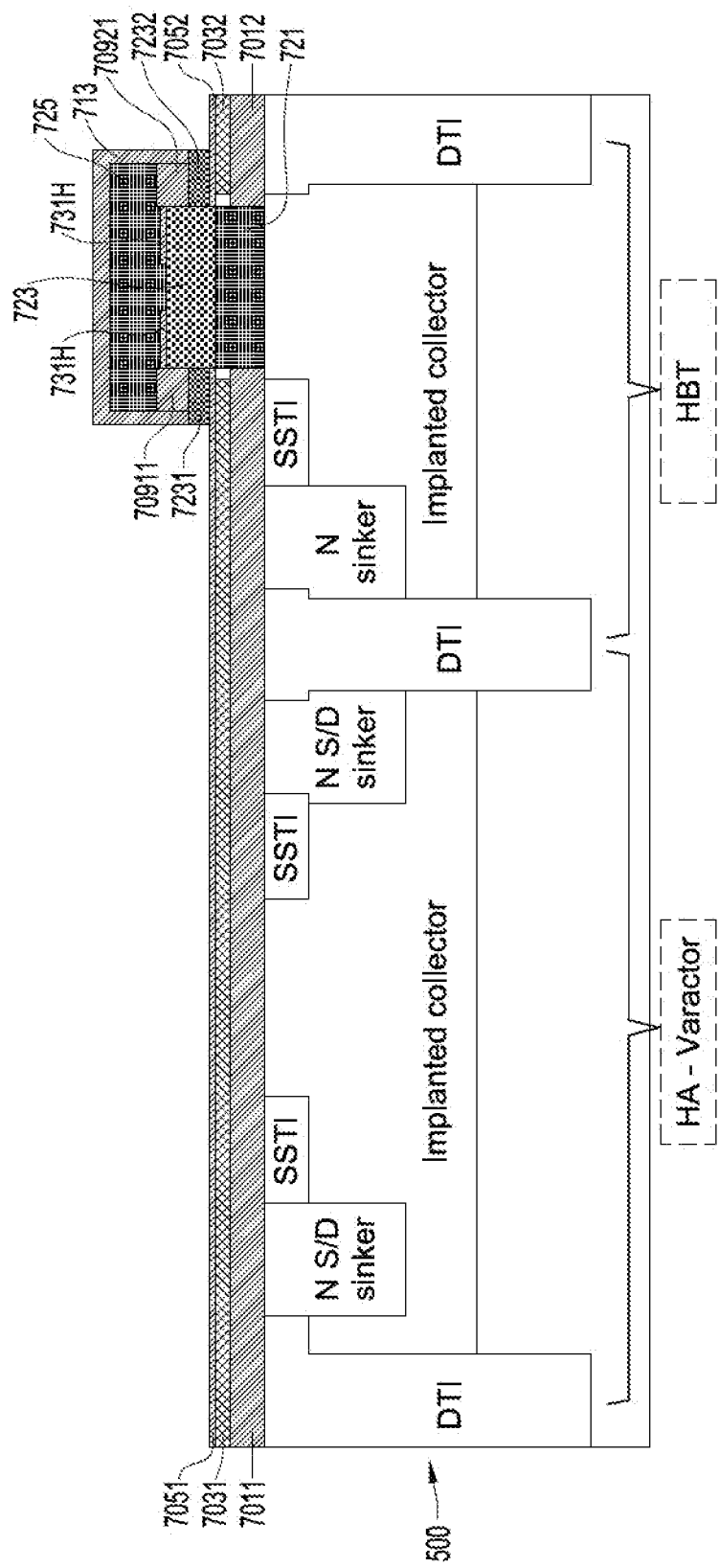

FIG. 9 shows, schematically and in cross-section, still another step of the embodiment of the method for producing a varicap diode and bipolar transistor, made from the structure as disclosed in relation with FIG. 8. The step disclosed in relation with FIG. 9 is more particularly dedicated to producing a part of the future bipolar transistor 300.

During this step, the notches 740 (FIG. 8) are completely filled in by links 7231, 7232 (respectively located on the left and right of the second deposit 723, in FIG. 9).

These links 7231 and 7232 are made by depositing a doped material with the second conductivity type, in this example, type p. Preferably, the same material is used as that from which the second deposit 723 is constituted. This then amounts to extending the second deposit 723, constituting the intrinsic base of the transistor 300, until it is level with the outer lateral surfaces of the seventh layer 713 covering the third deposit 725.

FIG. 10 shows, schematically and in cross-section, still another step of the embodiment of the method for producing a varicap diode and bipolar transistor, made from the structure as disclosed in relation with FIG. 9. The step disclosed in relation with FIG. 10 is more particularly dedicated to producing a part of the future varicap diode 100.

During this step, the first areas 7011, 7031 and 7051 of the layers 701, 703 and 705, respectively, are locally etched over their entire thickness. This etching is done level with part of the upper surface 501 of the substrate 500 where the extrinsic collector region 525 is flush, located in the diode location. This amounts to making a vertical opening 750 passing through the first areas 7011, 7031 and 7051 of the layers 701, 703 and 705. Part of the extrinsic collector region 525 is thus stripped inserted between the shallow isolation trenches 530 and 532. In FIG. 10, one also exposes, during the etching, part of the upper surface of these shallow isolation trenches 530 and 532.

In FIG. 10, the opening 750 thus separates: first portions 7013, 7033 and 7053 (located to the left of the opening 750, in FIG. 10) of the first areas 7011, 7031 and 7051 of the layers 701, 703 and 705, respectively; and second portions 7014, 7034 and 7054 (located to the right of the opening 750, in FIG. 10) of the first areas 7011, 7031 and 7051 of the layers 701, 703 and 705, respectively.

According to one preferred embodiment, an ion implantation is further done, below the part of the upper surface 501 where the extrinsic collector region 525 is flush, of a doping element of the first conductivity type, in this example, type n. One thus creates, in the substrate 500, a sector 527 having an increased doping relative to the initial doping, that is to say, before implantation, in the same location. This implantation operation, forming the sector 527, makes it possible to modify the dopant profile of the region 525 of the extrinsic collector in the vicinity of the upper surface 501 of the substrate 500.

It is assumed hereinafter that the substrate 500 now includes a sector 527 as previously described.

FIG. 11 shows, schematically and in cross-section, still another step of the embodiment of the method for producing a varicap diode and bipolar transistor, made from the structure as disclosed in relation with FIG. 10. The step disclosed in relation with FIG. 11 is more particularly dedicated to producing a part of the future varicap diode 100.

During this step, a deoxidation operation is conducted to eliminate the majority of the second area 7052 of the third layer 705 and the majority of the first and second portions 7053, 7054 of the first area 7051 of the third layer 705. Only kept, in the transistor location, are: a first element 70541 of the second portion 7054, located level with the first link 7231; and a second element 70521 of the second portion 7052, located level with the second link 7232.

FIG. 12 shows, schematically and in cross-section, still another step of the embodiment of the method for producing a varicap diode and bipolar transistor, made from the structure as disclosed in relation with FIG. 11. The step disclosed in relation with FIG. 12 is more particularly dedicated to producing a part of the future varicap diode 100.

During this step, a selective deposit is done of an eighth layer 715 on the surface of the remaining parts of the second layer 703 and on the surface of the second extrinsic collector region 525.

More specifically, this eighth layer 715 is made up of four areas: a first area 7152 covering the entire free upper surface of the second area 7032 of the second layer 703; a second area 7153 covering the entire free upper surface of the first portion 7033 of the first area 7031 of the second layer 703; a third area 7154 covering the entire free upper surface of the second portion 7034 of the first area 7031 of the second layer 703; and a fourth area 7155 covering, in the example of FIG. 12 where the sector 527 has been made below the surface 501 of the substrate 500, the upper surface of this sector 527.

The areas 7152 to 7155 of the eighth layer 715 are, for example, formed by epitaxial growth. Preferably, the same material is used as that from which the second layer 703 is constituted (FIG. 2). This then amounts to: increasing the thickness of the area 7032 and remaining portions 7033, 7034 of the second layer 703 by a value, denoted h, equal to the thickness of the areas 7152 to 7154; and creating an area 7154 level with the sector 527.

This thickness h is inspected such that the areas 7154 and 7152 respectively come into contact with the links 7231 and 7232 located in the transistor location. The areas 7154 and 7152 are thus, by means of the links 7231 and 7232, placed in contact with the intrinsic base 723 of the transistor 300. The areas 7154 and 7152 of the eighth layer 715 then form an extrinsic base of the transistor 300.

The area 7155 is, in this example, of type p. This area 7155 therefore forms, with the sector 527, still in this example, of type n, a p-n junction. In other words, the area 7155 forms a doped region 7155 with the second conductivity type, here type p, of the diode 100.

In the case where the substrate 500 does not have a sector 527 in its extrinsic collector region 525, the region 7155 and the region 525 jointly form the p-n junction of the diode 100.

Figure 13:
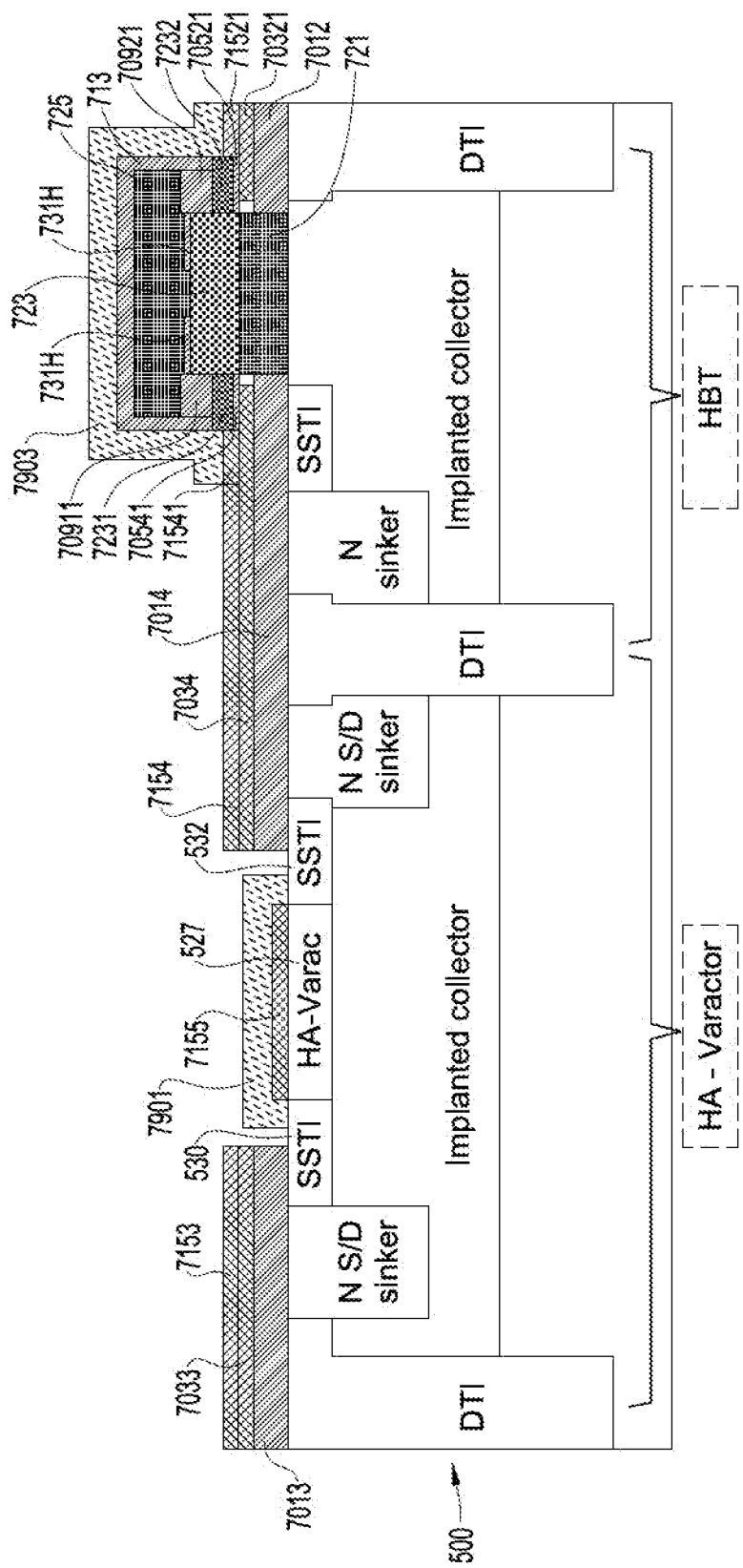

FIG. 13 shows, schematically and in cross-section, still another step of the embodiment of the method for producing a varicap diode and bipolar transistor, made from the structure as disclosed in relation with FIG. 12.

During this step, the diode 100 and the transistor 300 are protected by a sacrificial layer 790 with a view to later steps. The area 7155 is thus covered, in the diode location, by a first portion 7901 of the layer 790. In FIG. 13, the lateral parts of this portion 7901 also partially cover the shallow isolating trenches 530 and 532.

One also covers, in the transistor location, the structure forming the future transistor 300 with a second portion 7903 of the layer 790. In FIG. 13, this layer 790 portion 7903 in particular covers: the upper face and the lateral faces of the seventh layer 713; and the free lateral faces of the links 7231 and 7232.

The portion 7903 made in the transistor location also extends over: a portion 71541 of the area 7154 located near the first link 7231; and aa portion 71521 of the area 7152 (not visible in FIG. 13) located near the second link 7232.

These protections are for example done by: a first operation consisting of depositing the layer 790 for example made by a photolithography photoresist; a second operation consisting of exposing, through a mask, this photoresist layer 790; and a third operation consisting of eliminating parts of the photoresist layer 790 thus exposed.

The mask is then designed so as only to retain, after elimination of the exposed photoresist, nonexposed portions of the photoresist layer 790, in this example, the first and second portions 7901 and 7903 of the layer 790.

Figure 14:
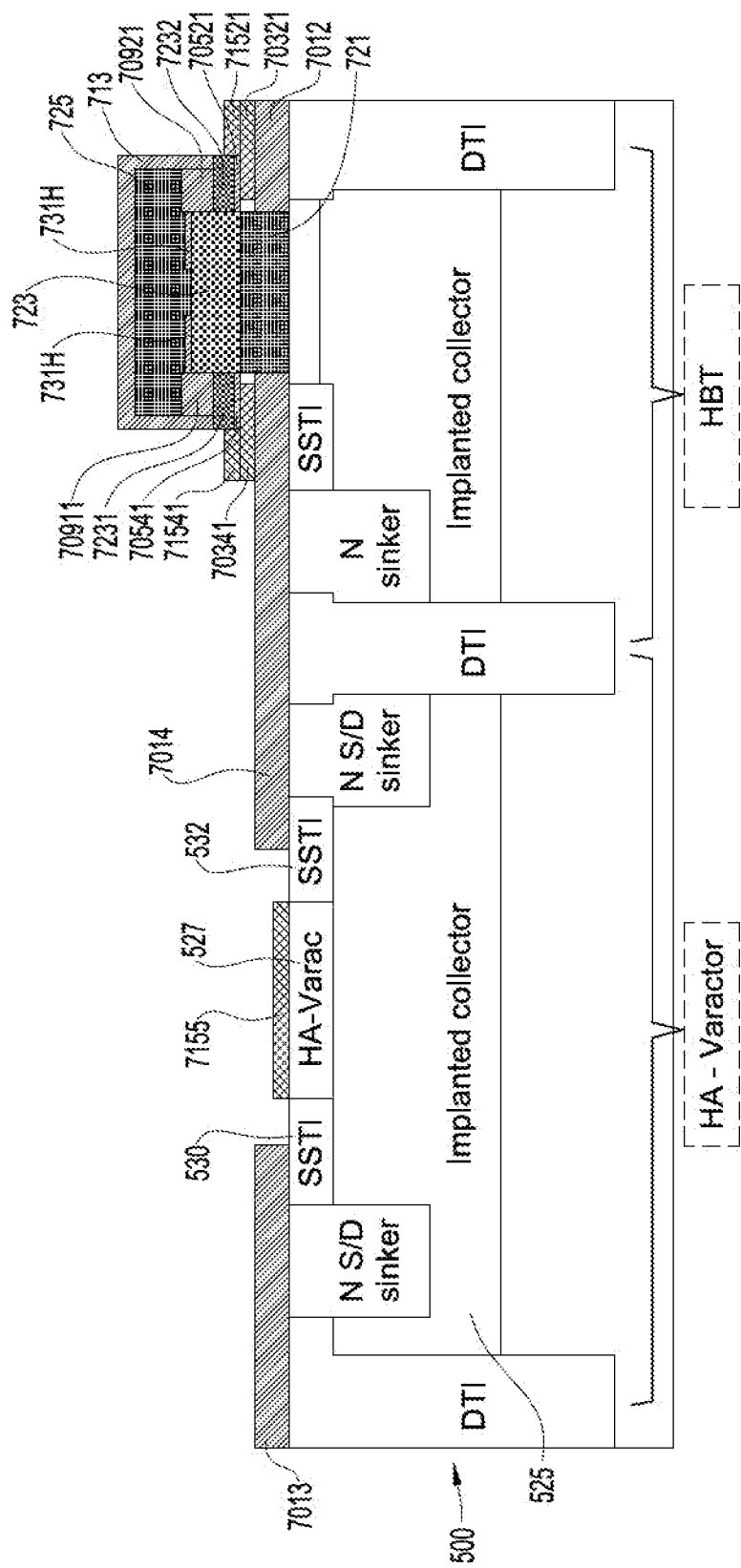

FIG. 14 shows, schematically and in cross-section, still another step of the embodiment of the method for producing a varicap diode and bipolar transistor, made from the structure as disclosed in relation with FIG. 13.

During this step, an etching operation is performed, for example, by a dry etching method (for example, plasma etching) in order to eliminate all of the areas unprotected areas of the layers 703 and 715.

More specifically, one eliminates: the entire first portion 7033 of the first area 7031 of the second layer 703; the entire second area 7153 of the eighth layer 715; part of the second portion 7034 of the first area 7031 of the second layer 703 not located level with the second portion 7903 of the protection layer 790; part of the third area 7154 of the layer 715 not covered by the second portion 7903 of the protection layer 790; part of the second area 7032 (not visible in FIG. 14) of the second layer 703 not located level with the second portion 7903 of the protection layer 790; and part of the first area 7152 of the layer 715 not covered by the second portion 7903 of the protection layer 790.

The portions 7901 and 7903 (not visible in FIG. 14 because of removal at the end of the step for elimination of the unprotected areas listed above) are next removed from the sacrificial protection layer 790.

Thus retained, as illustrated in FIG. 14, are: the entire fourth area 7155; a portion 71541 of the third area 7154 of the layer 715; a portion 71521 of the first area 7152 of the layer 715; an element 70341 of the second portion 7034 of the first area 7031 of the second layer 703, located level with the portion 71541 and below part of the element 70541; and an element 70321 of the second area 7032 of the second layer 703, located level with the portion 71521 and below part of the element 70521.

Figure 15:
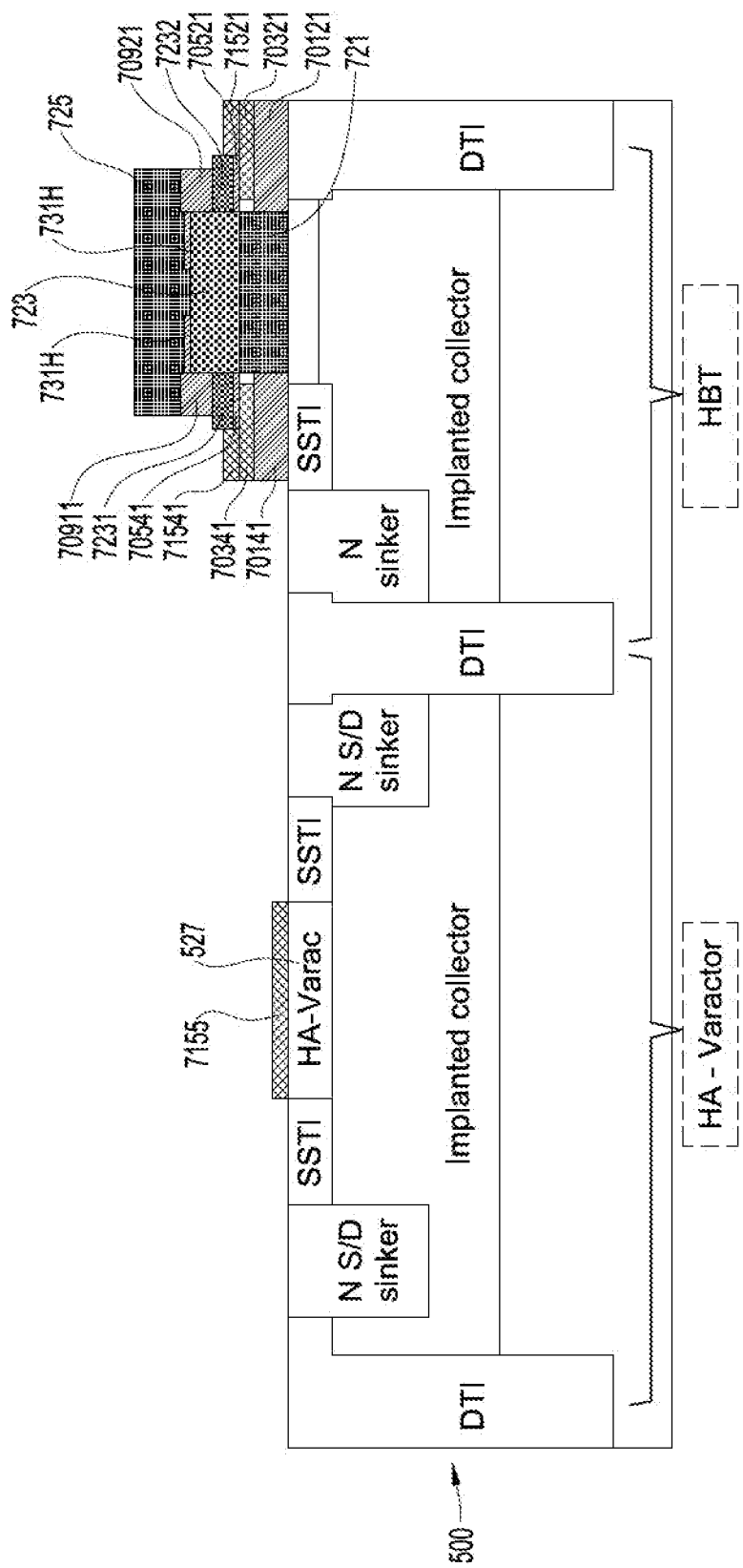

FIG. 15 shows, schematically and in cross-section, still another step of the embodiment of the method for producing a varicap diode and bipolar transistor, made from the structure as disclosed in relation with FIG. 14.

During this step, the uncovered parts of the first layer 701 and the entire seventh layer 713 are eliminated. To that end, an etching operation is carried out, for example wet etching, of the second area 7012 of the first layer 701 and of the first and second portions 7013 and 7014 of the first area 7011 of the first layer 701.

More specifically, this etching operation results in eliminating: the entire seventh layer 713; the entire first portion 7013 of the first area 7011 of the first layer 701; eliminating part of the second portion 7014 of the first area 7011 of the first layer 701 not covered by the element 70341; and eliminating part of the second area 7012 of the first layer 701 not covered by the element 70321.

One thus retains: an element 70141 of the second portion 7014 of the first area 7011 of the first layer 701, located level with the element 70341 and the element 70541; an element 70121 of the second area 7012 of the first layer 701, located level with the element 70321 and the element 70521.

Figure 16:
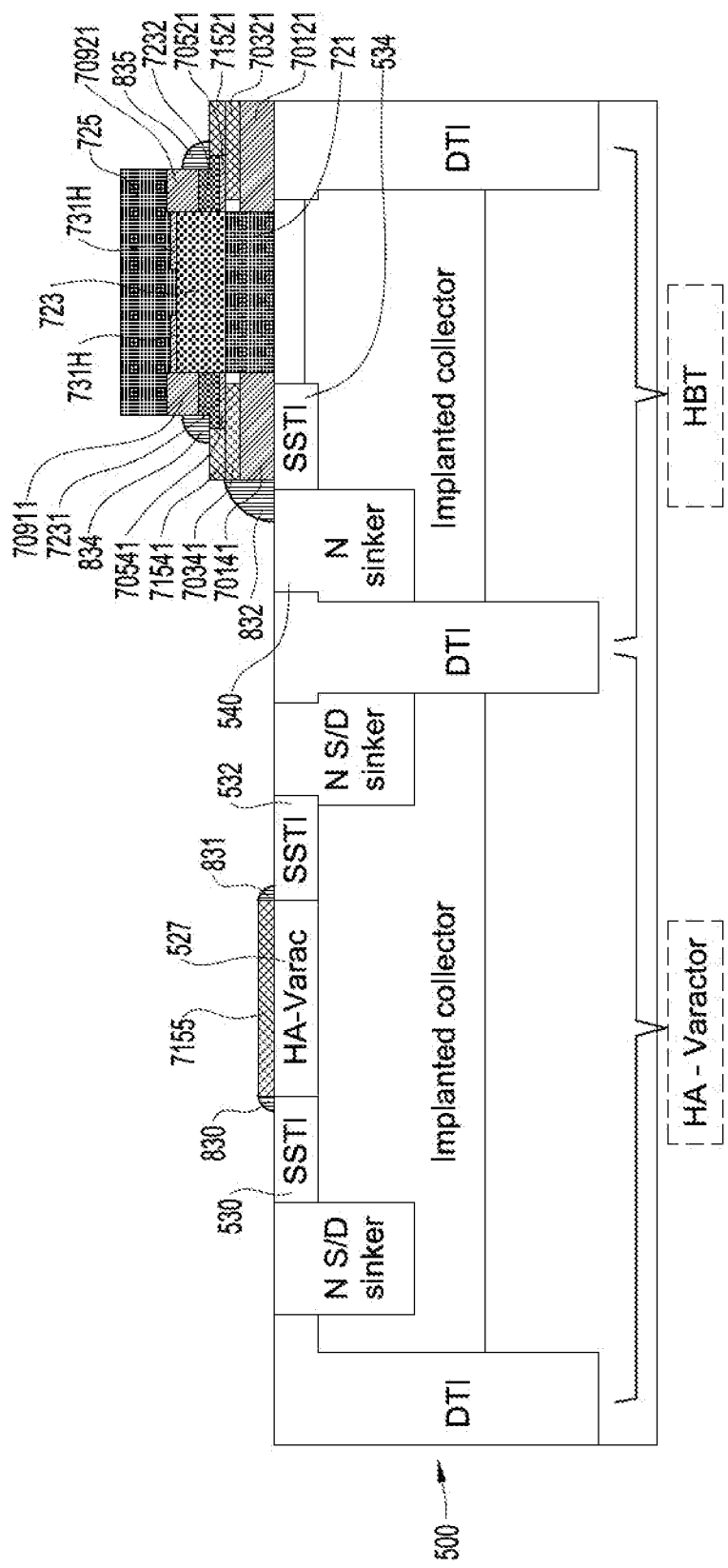

FIG. 16 shows, schematically and in cross-section, still another step of the embodiment of the method for producing a varicap diode and bipolar transistor, made from the structure as disclosed in relation with FIG. 15.

During this step, MOS spacers are formed in locations where the structure as described in relation with FIG. 15 has right angles. In particular, the following are produced: two first MOS spacers 830 and 831; two second MOS spacers 832 and 833 (only the second MOS spacer 832 is shown in FIG. 16); and two third MOS spacers 834 and 835.

The first MOS spacers 830 and 831 are located on either side of the area 7155 and partially cover the shallow isolating trenches 530 and 532, respectively.

The second MOS spacer 832 shown in FIG. 16 covers: the free lateral face of the element 70341; the free lateral face of the element 70141; the free surface of the shallow isolating trench 534; part of the free surface of the sink 540.

The second MOS spacer 833, not shown in FIG. 16, is made symmetrically relative to the intrinsic collector 721 of the transistor 300.

The third MOS spacers 834 and 835 cover: a part of the lateral surface of the portions 70911 and 70921, respectively; a part of the free surface, or free surfaces, of the links 7231 and 7232, respectively; and a part of the upper surface of the elements 70541 and 71521, respectively.

Figure 17:
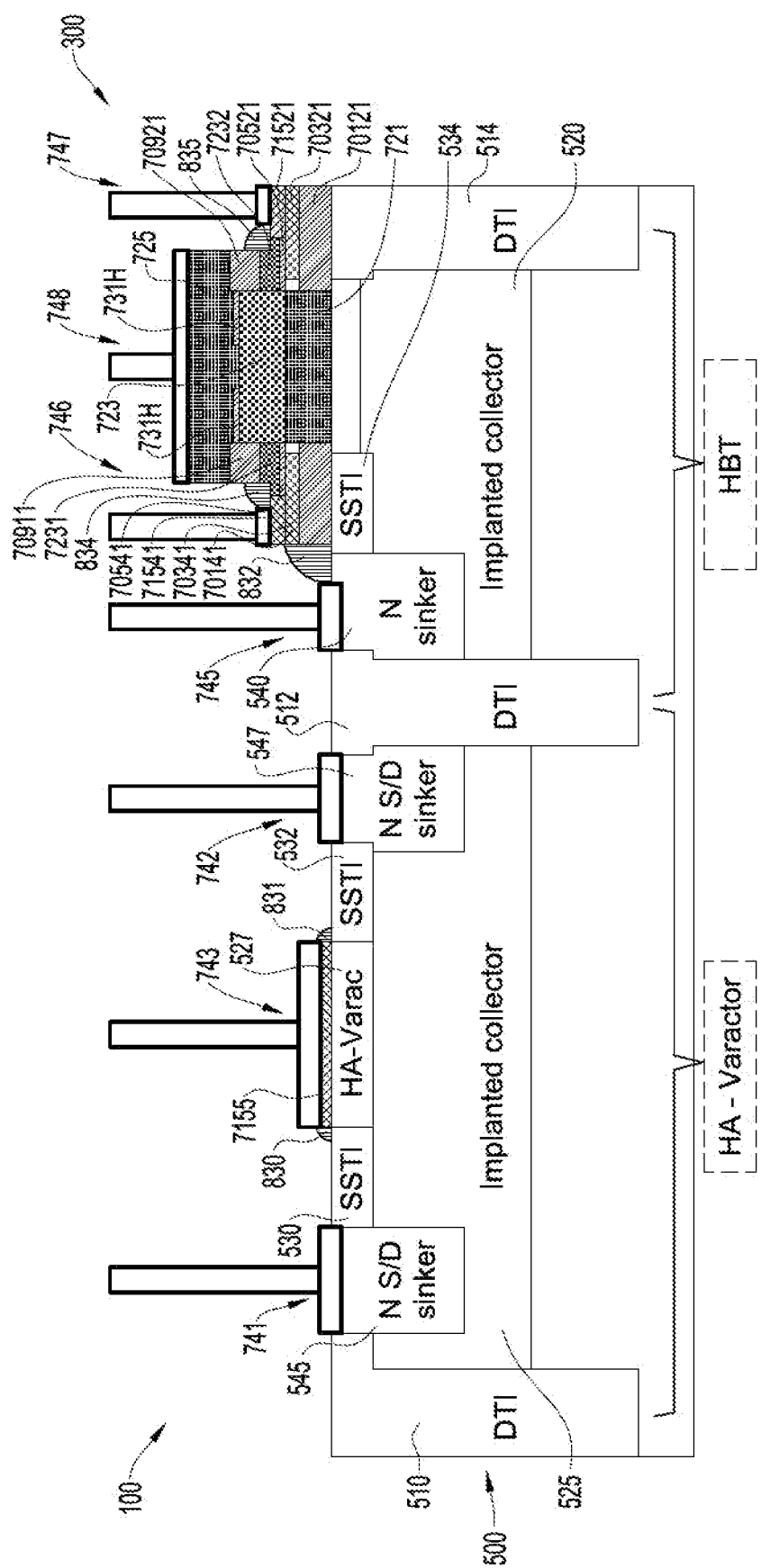

FIG. 17 shows, schematically and in cross-section, still another step of the embodiment of the method for producing a varicap diode and bipolar transistor, made from the structure as disclosed in relation with FIG. 16.

During this step, first contact reacting elements 741, 742 and 743 of the varicap diode 100 and second contact reacting elements 745, 746, 747 and 748 of the transistor 300 are produced.

More particularly, for the varicap diode 100: the contact reacting element 741 is made on the entire upper surface of the sink 545; the contact reacting element 742 is made on the entire upper surface of the sink 547; and the contact reacting element 743 is made on the entire upper surface of the area 7155.

The contact reacting elements 741 and 742 are therefore connected to the power grid 527 while the contact reacting element 743 is connected to the area 7155. The power grid 527 is doped of the first type, in the example type n. The area 7155 is doped of the second type, in this example type p.

The elements 741 and 742 constitute, in this example, cathode contacts or terminals of the varicap diode 100. The element 743 constitutes, still in this example, an anode contact or terminal of the varicap diode 100.

More particularly, for the transistor 300: the contact reacting element 745 is made on the entire upper surface of the sink 540; the contact reacting element 746 is made on the upper surface of the portion 71541 not covered by the MOS spacer 734; the contact reacting element 747 is made on the upper surface of the portion 71521 not covered by the MOS spacer 735; the contact reacting element 748 is made on the entire upper surface of the third deposit 725.

The contact reacting element 745 is therefore connected to the first deposit 721 (intrinsic collector). The contact reacting elements 746 and 747 are connected to the second deposit 723 (intrinsic base). The contact reacting element 748 is connected to the third deposit 725 (intrinsic emitter).

The first deposit 721 is doped of the first type, in this example, type n. The second deposit 723 is doped of the second type, in this example, type p. The third deposit 725 is doped of the first type, in this example, type n.

The contact reacting element 745 constitutes a collector contact or terminal of the transistor 300. The contact reacting elements 746 and 747 constitute base contacts or terminals of the transistor 300. The contact reacting element 748 constitutes an emitter contact or terminal of the transistor 300.

The embodiment of the method whose successive steps have been described in relation with FIGS. 1 to 17 has the advantage of making it possible to produce, at the same time, the variable capacitance diode 100 and the bipolar transistor 300. This therefore reduces the number of manufacturing steps of the diode 100 and the transistor 300 relative to a method where the diode 100 and the transistor 300 are made separately.

Another advantage of the embodiment described above lies in the fact that the area 7155 is preferably made by epitaxial growth. In this example, this thus allows the area 7155 and the power grid 527 to form a p-n junction having a very pronounced interface, that is to say, near which the dopant profile varies greatly. One thus obtains a varactor 100 with "hyperabrupt" p-n junction, in other words, a variable capacitance diode provided with an abrupt dopant profile near the interface of the p-n junction.

Figure 18:
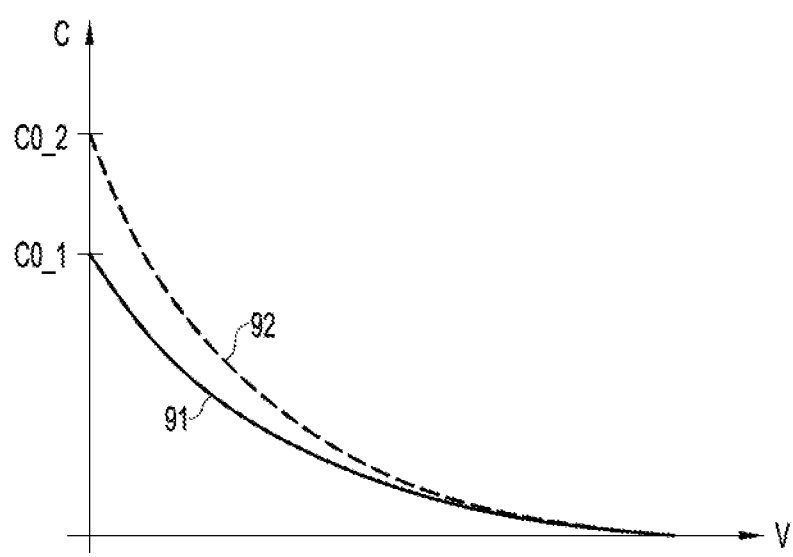
FIG. 18 shows variation curves of a characteristic property of the varicap diodes obtained using the embodiment of the method as described.

FIG. 18 shows variation curves of a characteristic property of the varicap diodes obtained using the embodiment of the method as described.

FIG. 18 reflects variations of the electrical capacitance (C) of the variable capacitance diode 100 as a function of a voltage (V) with reversed polarization applied between the anode (terminal 743 in FIG. 17) and the cathode (terminals 741 and 742, in FIG. 17) of the diode 100.

More specifically: a first curve 91 in solid lines illustrates the capacitance variation of a diode 100 without a region 525 within its extrinsic collector region 525; and a second curve 92 in dotted lines illustrates the capacitance variation of a diode 100 having a region 525 within its extrinsic collector region 525.

For a nil polarization voltage V, the diode without the region 525 has a capacitance, denoted C0_1, below the capacitance, denoted C0_2, of the diode having the region 525. In general, the presence of the region 525 makes it possible to increase the electrical capacitance of the variable capacitance diode 100.

Various embodiments and modes of implementation have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A method, comprising jointly producing a bipolar transistor and a variable capacitance diode on a common substrate;
wherein jointly producing comprises:
forming an extrinsic base of the bipolar transistor;
filling a notch between areas of a layer with a link that makes contact with the extrinsic base; and
forming the variable capacitance diode to include a first region with a first type of conductivity and a second region with a second type of conductivity;
wherein the first region and an area making contact to the link are formed from a layer deposited in a same deposition step.

2. The method according to claim 1, wherein said first region is in contact with said second region located at a same level as an extrinsic collector region within a substrate.

3. The method according to claim 1, further comprising epitaxially forming said first region.

4. The method according to claim 1, further comprising doping a sector of said second region by ion implantation.

5. The method according to claim 4, wherein said diode is a varactor with a hyperabrupt p-n junction formed by the first region and said sector.

6. The method according to claim 1, wherein the first type of conductivity is p-type and the second type of conductivity is n-type.

7. The method according to claim 1, wherein the first type of conductivity is n-type and the second type of conductivity is p-type.

8. A method, comprising:
jointly producing a bipolar transistor and a variable capacitance diode on a common substrate;
wherein jointly producing comprises:
forming a p-n junction for said variable capacitance diode comprising a first region having a first conductivity type located on top of a second region having a second conductivity type;
forming an intrinsic collector for said bipolar transistor having the second conductivity type and an intrinsic emitter for said bipolar transistor having the second conductivity type, said intrinsic collector and intrinsic emitter separated by an intrinsic base having the first conductivity type;
filling a notch between area of a first layer with a link that makes contact with the extrinsic base;
forming the first region of the variable capacitance diode and area making contact to the link from a second layer deposited in a same deposition step;
forming first MOS spacers on side edges of a patterned layer forming the first region; and
forming a second MOS spacer adjacent a side edge of an insulating layer which insulates the intrinsic collector of the bipolar transistor.

9. The method of claim 8, wherein a height of the first and second MOS spacers is below said area making contact to the link.

10. The method of claim 8, wherein said first region is in contact with said second region located at a same level as an extrinsic collector region within the common substrate.

11. The method of claim 8, further comprising epitaxially forming said first region.

12. The method of claim 8, further comprising doping a sector of said second region by ion implantation.

13. The method according to claim 12, wherein said diode is a varactor with a hyperabrupt p-n junction formed by the first region and said sector.

14. The method of claim 8, wherein the first type of conductivity is p-type and the second type of conductivity is n-type.

15. The method of claim 8, wherein the first type of conductivity is n-type and the second type of conductivity is p-type.

16. A method, comprising:
depositing, on a surface of a substrate, a stack formed by a first layer, a second layer covering said first layer, a third layer covering said second layer, a fourth layer covering said third layer, a fifth layer covering said fourth layer, and a sixth layer covering said fifth layer;
forming a through opening in said stack at a location where a first extrinsic collector region in said substrate is located, said through opening forming a first opening separating said stack into a first stack made up of first areas of said first through sixth layers and a second stack made up of second areas of said first through sixth layers;
producing, in said first opening, a first deposit and a second deposit, said second deposit completely covering said first deposit;
producing spacers in said first opening, said spacers each having a first part and a second part, said first part constituted by a horizontal portion partially covering an upper surface of said second deposit, and a vertical portion flush with one of an upper surface of said first area of the sixth layer or an upper surface of said second area of said sixth layer;
removing said first area of said sixth layer, said second area of said sixth layer, said vertical portions of said first parts of said spacers and said second parts of said spacers;
producing a third deposit above said second deposit, said horizontal portions of said first parts of said spacers, a portion of said first area of said fifth layer and a portion of said second area of said fifth layer;
removing said first area of said fifth layer with the exception of said portion of said first area of said fifth layer and removing said second area of said fifth layer with the exception of said portion of said second area of said fifth layer;
depositing a seventh layer covering the upper surface of said third deposit, lateral surfaces of said third deposit, lateral surfaces of said portion of said first area of said fifth layer and lateral surfaces of said portion of said second area of said fifth layer;
removing all of said first area of said fourth layer and removing all of said second area of said fourth layer;
producing, below said portion of said first area of said fifth layer and a vertical portion of said seventh layer, a first link contacting said second layer and producing, below said portion of said second area of said fifth layer and a vertical portion of said seventh layer, a second link contacting said second layer;
forming a through opening in said first areas of said first, second and third layers at a location where a second extrinsic collector region in said substrate is located, said through opening forming a second opening separating said first, second and third layer of the first area into a first portion and a second portion;
removing portions of said third layer which are not covered by said first and second links; and
depositing an eighth layer which includes a first area of said eighth layer on a surface of the second layer and in contact with the first link, a second area said eighth layer on the surface of the second layer and in contact with the second link and a third area of said eighth layer on a surface of the second extrinsic collector region.

17. The method of claim 16, further comprising:
forming a more highly doped region of the second extrinsic collector region, wherein the third area of said eighth layer is deposited in contact with the more highly doped region to form a variable capacitance diode;
wherein the first extrinsic collector region forms part of a collector of a bipolar transistor.

18. The method of claim 17, further comprising:
forming a shallow trench isolation which delimits the more highly doped region; and
forming deep trench isolations which delimit the first and second extrinsic collector regions.

19. The method of claim 16, further comprising:
depositing a sacrificial layer that includes a first portion covering said first region and a second portion covering said seventh layer, said first link and said second link, said second portion of said sacrificial layer extending laterally over a first element of said third area of said eighth layer and over a second element of said first area of said eighth layer;
removing parts of said areas and portions of said eighth layer and said second layer not covered by said first and second portions of said sacrificial layer;
completely removing said first portion of said first area of said first layer, removing said second portion of said first area of said first layer with the exception of a fifth element covered by said third element and removing said second area of said first layer with the exception of a sixth element covered by said fourth element; and
producing second spacers on either side of said first region, producing third spacers on either side of said first deposit and producing fourth spacers on either side of said second deposit.

20. The method of claim 19, further comprising:
producing a first contact element on said second trench, a second contact element on said third trench, a third contact element on said first region, a fourth contact element on said first sink, a fifth contact element on said first element of said third area of said eighth layer, a sixth contact element on said second element of said first area of said eighth layer and a seventh contact element on said third deposit, said first, second and third contact elements constituting terminals of said variable capacitance diode, said fourth contact element constituting a collector terminal of said bipolar transistor, said fifth and seventh contact elements constituting base terminals of said bipolar transistor and said eighth contact element constituting an emitter terminal of said bipolar transistor.

21. A method of jointly producing a bipolar transistor and a variable capacitance diode on a substrate, comprising:
a) depositing first, second, third, fourth, fifth and sixth layers above an upper face of the substrate;
b) forming a first opening passing through said first through sixth layers in line with a first region of a first type of conductivity in the substrate which forms a first extrinsic collector of the bipolar transistor;
c) providing, in the first opening, an intrinsic collector and an intrinsic base of the bipolar transistor, wherein the intrinsic base completely covers the intrinsic collector;
d) forming, in the first opening over an upper face of the intrinsic base, two first spacers;

e) removing the sixth layer and the two first spacers with the exception of horizontal portions of the two first spacers which partially cover the upper face of the intrinsic base;

f) forming a first deposit on top of the intrinsic base, said horizontal portions of the two first spacers and portions of the fifth layer and removing the fifth layer with the exception of said portions of the fifth layer;

g) depositing a seventh layer covering an upper face and side faces of the first deposit and side faces of the portions of the fifth layer and removing the fourth layer;

h) forming first and second links contacting the intrinsic base;

i) forming a second opening through the first, second and third layers, to reach a second extrinsic collector of the first type of conductivity in the substrate;

j) eliminating the third layer with the exception of first and second elements located respectively in line with the first and second links;

k) selectively depositing an eighth layer on the surface remaining parts of the second layer and on the surface of the second extrinsic collector, the selective deposition of the eighth layer surface of the second extrinsic collector region forming a first region of a second conductivity type of a PN junction of the variable capacitance diode;

l) protecting the variable capacitance diode and the bipolar transistor with first and second portions of a sacrificial layer and eliminating all the unprotected areas of the second and eighth layers; and m) removing the first and second portions of the sacrificial layer, eliminating parts not covered by the first layer and removing the seventh layer.

22. The method of claim 21, further comprising, after step m), forming:
first spacers on each side of the first region of the PN junction of the variable capacitance diode; and
second spacers on each side of the intrinsic collector of the bipolar transistor.

23. The method of claim 21, wherein the first region of the PN junction of the variable capacitance diode and the extrinsic base of the bipolar transistor are made using the same step k).

24. The method according to claim 21, wherein the first region of the PN junction of the variable capacitance diode is produced by epitaxy.

25. The method according to claim 21, wherein a sector of the second region is doped by ion implantation.

26. The method according to claim 21, wherein the first type of conductivity is P and the second type of conductivity is N.

27. The method according to claim 21, wherein the first type of conductivity is N and the second type of conductivity is P.

28. The method according to claim 21, wherein the variable capacitance diode is a hyperabrupt PN junction varactor.

29. The method according to claim 21, further comprising, after step m), forming spacers on either side of the intrinsic collector and forming spacers on either side of the intrinsic base.

* * * * *